United States Patent [19]

Mohara et al.

[11] Patent Number: 5,342,474
[45] Date of Patent: Aug. 30, 1994

[54] PARTS FEEDER

[75] Inventors: Masayuki Mohara, Ohizumi; Takahiro Kitajima, Ohta, both of Japan

[73] Assignee: Sanyo Electric Co., Ltd., Osaka, Japan

[21] Appl. No.: 992,039

[22] Filed: Dec. 17, 1992

[30] Foreign Application Priority Data

Dec. 19, 1991 [JP] Japan .................................. 3-336897

[51] Int. Cl.$^5$ ............................................ B32B 31/00
[52] U.S. Cl. ..................................... 156/584; 156/556
[58] Field of Search ........................ 156/344, 556, 584

[56] References Cited

U.S. PATENT DOCUMENTS

| | | | |
|---|---|---|---|
| 4,437,129 | 3/1984 | Yoshida et al. | 360/85 |
| 4,735,341 | 4/1988 | Hamilton et al. | 221/1 |
| 4,869,393 | 9/1989 | Soth | 156/344 X |

Primary Examiner—David A. Simmons
Assistant Examiner—Paul M. Rivard
Attorney, Agent, or Firm—Armstrong, Westerman, Hattori, McLeland & Naughton

[57] ABSTRACT

A parts feeder, comprising a feed table, a plurality of parts feed units arranged on the feed table, each parts feed unit including a carrying tape carrying parts, a cover tape covering the parts, a device peeling the cover tape, a tape dispenser, and a shutter shutting a space above the position of the dispensation of the parts, a sucker sucking the parts at a position of a suction of the parts, each of the parts feed units including a tape feed drive driving the tape dispenser and shutter drive separate from the tape feed drive, the shutter drive driving the shutter, a tape feed drive provided outside the parts feed units and driving the tape feed drive of the parts feed unit positioned at a position other than the position of the suction of the parts so that the parts feed unit at the position other than the position of the suction of the parts feeds a part forward before the sucker sucks the part at the position of the suction of the parts, and a shutter drive positioned outside the parts feed units driving the shutter drive of the parts feed unit which has been positioned at the position of the suction of the parts by the feed table, to cause the shutter to open the space, the shutter drive outside the parts feed units causing the shutter to shut the space after the sucker has sucked the part out of the parts feed unit at the position of the suction of the parts.

4 Claims, 16 Drawing Sheets

POSITION OF SUCTION

POSITION OF SUCTION

PARTS FEEDER

BACKGROUND OF THE INVENTION

1. Field of the Invention

The present invention relates to a parts feeder dispensing chip-shaped electronic parts.

2. Background Art

Japanese unexamined Laid-open patent publication SH0.60-24100 discloses a parts feeder, comprising a feed table having an upper surface and moving horizontally, a plurality of parts feed units arranged on the upper surface of the feed table, each of the parts feed units including a carrying tape carrying parts arranged on one surface of the carrying tape, a cover tape attached to the one surface of the carrying tape and covering the parts, means for peeling the cover tape from the carrying tape, means for dispensing the carrying tape and the cover tape at a position of a dispensation of the parts in the part feed unit while the peeling means peels the cover tape from the carrying tape, and a shutter shutting a space above the position of the dispensation of the parts to prevent the parts from escaping from the position of the dispensation of the parts, the parts feeder comprising a sucker sucking the parts at a position of a suction of the parts via the position of the dispensation of the parts in a parts feed unit positioned at the position of the suction of the parts by the feed table. In this prior art parts feeder, a shutter operates in interlock with the operation of a ratchet of a tape dispensing means. That is, when the tape is dispensed, the shutter covers a part being delivered to a position of a dispensation of the parts. On the other hand, the shutter is moved in interlock with a return of the ratchet when the parts have been positioned, to open a space above the position of the dispensation of the parts to allow the tubular sucker to suck the part. The shutter is in the open position until a next feed of the tape after the tape has been dispensed, to uncover the space above the position of the dispensation of the parts. Therefore, if the prior art parts feeder has the so-called feedforward control system of dispensing the parts at a position other than a position of the suction of the parts at which the sucker picks up the parts, in order to increase the speed of the parts feeder, the parts which have been delivered to the position at which the parts are fed may be uncovered and escape while the parts feed unit travels from that position to the position of the suction of the parts.

In order to eliminate this drawback, Japanese unexamined patent application publication SH0.61-64199 discloses a technique by which an action against the force of a tension spring of a feed lever of a parts feed unit opens a shutter to allow a chuck to take out a part, a push by the kicker is released, and the tension spring returns the feed lever to operate the shutter and feed a tape. In this case, since the tension spring applies its force directly to the tape, which impacts the tape and may break sprocket holes in the tape, and the inertia of a tape feed mechanism may fail to stop the tape at a required position and to disorder the feed of the tape if a Z-table constituting a feed table moves before the kicker removes from the feed lever in order to increase the speed of the parts feeder, the parts feeder is designed so that the kicker regulates a return of the feed lever and subsequently removes from the feed lever and the Z-table subsequently moves.

However, in the parts feeder in which the kicker removes from the feed lever and then the Z-table moves, the stay time of the feed table must be shortened, the return speed of the feed lever must be accelerated and an acceleration of the feed speed of the tape must be increased for accelerating the speed of the parts feeder. The acceleration of the feed speed of the tape may break the sprocket holes in the tape and the inertia of the tape feed mechanism may fail to stop the tape at the required position, so that the tape feed of the parts feeder is unstable. Thus, this structure is inadequate to the acceleration of the speed of the parts feeder.

SUMMARY OF THE INVENTION

An object of the present invention is to provide a parts feeder preventing chip-shaped parts which have been delivered to a position of the dispensation of a part in a parts feed unit from escaping from a normal position by a shock in a movement of the feed table and dispensing parts at high speed.

In order to achieve the object, the present invention comprises a feed table having an upper surface and moving horizontally; a plurality of parts feed units arranged on the upper surface of the feed table, each of the parts feed units including a carrying tape carrying parts arranged on one surface of the carrying tape, a cover tape attached to the one surface of the carrying tape and covering the parts, means for peeling the cover tape from the carrying tape, means for dispensing the carrying tape and the cover tape at a position of a dispensation of the parts in the part feed unit while the peeling means peels the cover tape from the carrying tape, and a shutter shutting a space above the position of the dispensation of the parts to prevent the parts from escaping from the position of the dispensation of the parts; a sucker sucking the parts at a position of a suction of the parts via the position of the dispensation of the parts in a parts feed unit positioned at the position of the suction of the parts by the feed table; each of the parts feed units including a tape feed drive driving the tape dispensing means and shutter drive separate from the tape feed drive, the shutter drive driving the shutter; tape feed drive means provided outside the parts feed units and driving the tape feed drive of the parts feed unit positioned at a position other than the position of the suction of the parts so that the parts feed unit at the position other than the position of the suction of the parts feeds a part forward before the sucker sucks the part at the position of the suction of the parts; and shutter drive means positioned outside the parts feed units driving the shutter drive of the parts feed unit which has been positioned at the position of the suction of the parts by the feed table, to cause the shutter to open said space, the shutter drive means outside the parts feed units causing the shutter to shut said space after the sucker has sucked the part out of the parts feed unit at the position of the suction of the parts.

During the movement of the feed table, the shutter of the parts feed unit is in the operating position. When the parts feed unit has arrived at the position of the suction of the parts, the shutter drive means outside the parts feed units drives the shutter drive means of this parts feed unit to cause the shutter to open the space. There, the sucker sucks the part which has been positioned at the position of the dispensation of the parts by the tape feed drive means outside the parts feed units. Then, the shutter drive means outside the parts feed units drive the shutter to shut the space. Then, the feed table is moved.

In the present invention, since the parts feed unit comprises the tape feed drive and the shutter drive separate from the tape feed drive, the shutter drive can shut after the part held on the carrying tape has been uncovered. Thereby, the part does not escape from the tape feed unit during the movement of the feed table. No sprocket holes in the carrying tape are broken. The inertia of the tape dispensing means does not dislocate the carrying tape from the position of the dispensation of the parts. Thus, the speed of the parts feeder can be increased.

In a prior art parts feeder driving the shutter and the tape feed means of the parts feed unit by means of a common lever, opening the shutter may cause the parts feed unit to wastefully drive out the part which has been positioned at the position of the dispensation of the parts when the carrying tape is placed in the parts feed unit and operator confirms that the part is positioned at the position of the dispensation of the parts. On the other hand, the shutter drive of the present invention does not drive the tape feed drive, so that the tape feed drive does not drive out the part at the position of the dispensation of the parts in that confirmation.

DETAILED DESCRIPTION OF THE PREFERRED EMBODIMENTS

Preferred embodiments of the present invention will be described with reference to the drawings hereinafter.

Figure 1:
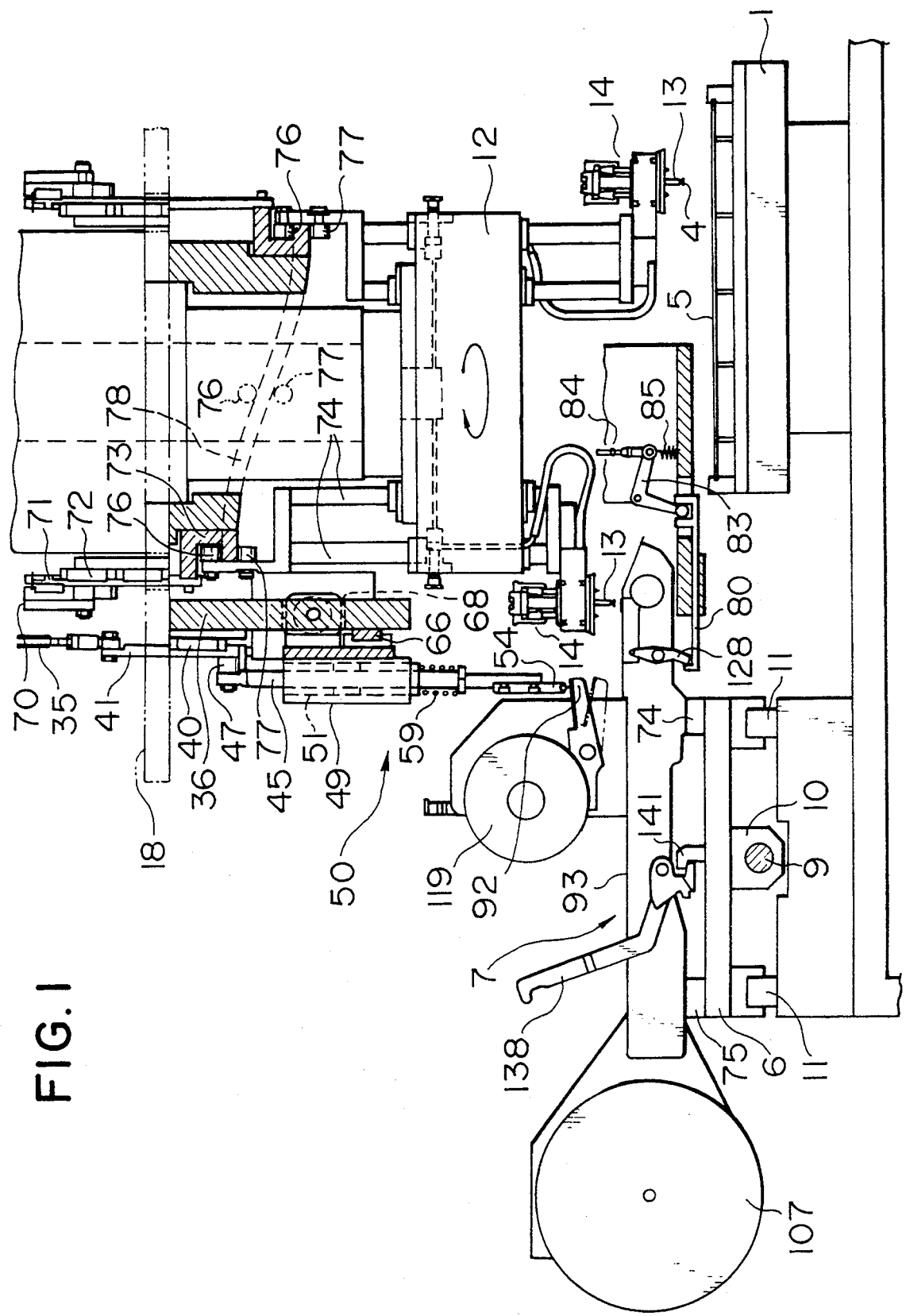
FIG. 1 is a front sectional view of a mechanism vertically moving and a mechanism horizontally moving tape driving tips.
Figure 2:
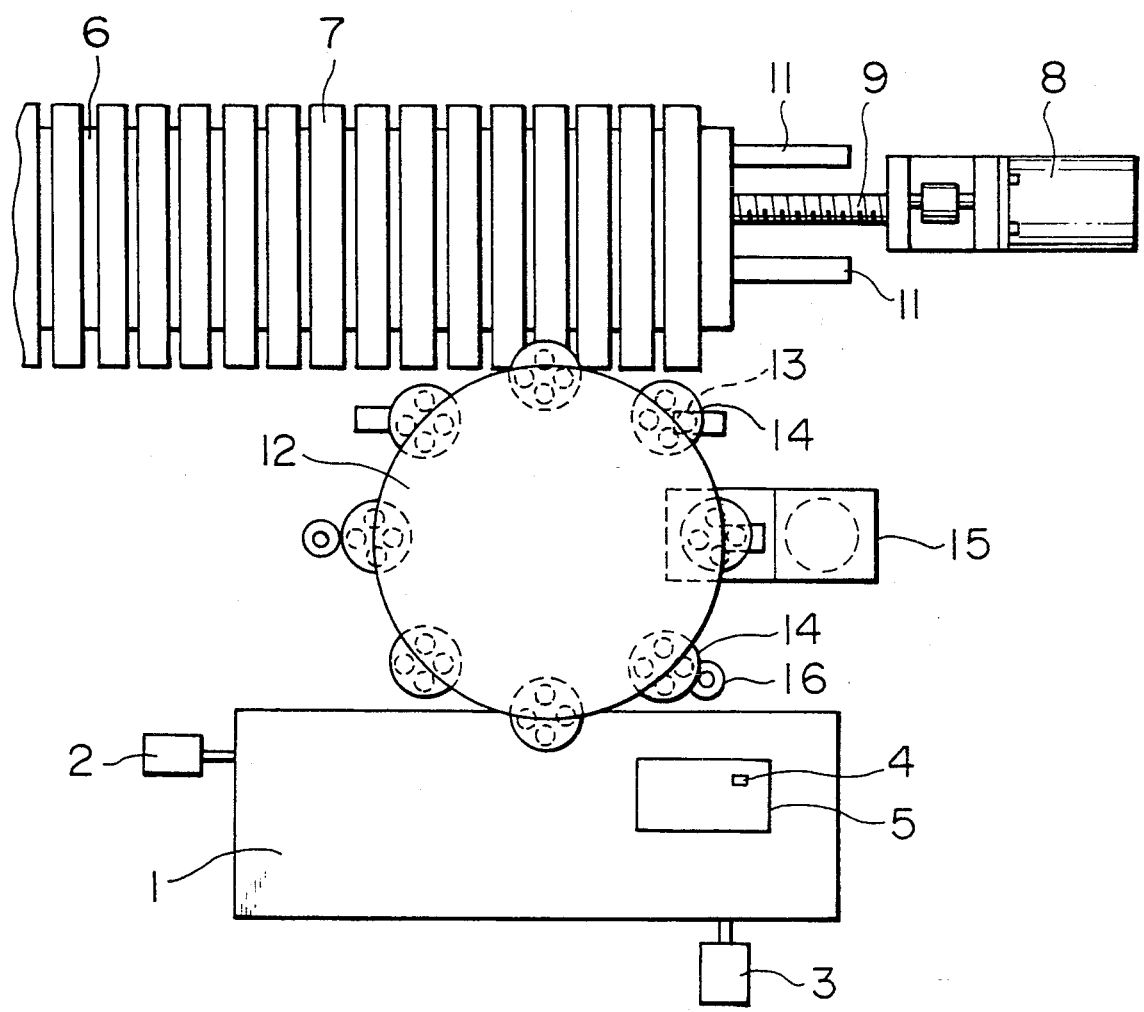
FIG. 2 is a plan view of a parts mounter in which the present invention is embodied.

An shown in FIGS. 1 and 2, an XY-table indicated at 1 is driven by an X-axial motor 2 and a Y-axial motor 3 to travel in the directions of X- and Y-axes. A printed circuit board 5 on which chip-shaped electronic parts 4 are mounted is placed on the XY-table 1. A feed table indicated at 6 receive a number of parts feed units indicated at 7 thereon. Each parts feed unit 7 feeds one kind of parts 4. A motor indicated at 8 in FIG. 2 for driving the feed table 6 rotates a ball bearing screw shaft indicated at 9 to move the feed table 6 along a linear guide indicated at 11 by means of an engagement of the ball bearing screw shaft 9 with a nut indicated at 10 fastened to the underside of the feed table 6. An index drive (not shown) including a motor (not shown) intermittently drives an indexing turntable indicated at 12. The periphery of the indexing turntable 12 has a plurality of parts sucking and mounting heads indicated at 14 arranged by an indexation pitch therearound. Each parts sucking and mounting head 14 includes four tubular suckers indicated at 13.

A stay position of the parts sucking and mounting heads 14 at which the suckers 13 pick up parts 4 out of the parts feed units 7 constitutes a suction station. The suckers 13 suck out parts 4 at a position of suction.

The parts sucking and mounting head 14 subsequently stays at a recognition station. There, a parts recognizer 15 recognizes a possible dislocation of a part 4 retained by the suckers 13. The parts sucking and mounting head 14 subsequently stays at an angle correction station. There, a sucker rotating roller 16 rotates the suckers 13 in the rotational direction on an axis of top and bottom in response to an output of the parts recognizer 15 to correct a possible rotational dislocation of the part 4. The parts sucking and mounting head 14 subsequently stays at a parts mounting station and mounts the part 4 retained by the suckers 13 on the printed circuit board 5.

Figure 3:
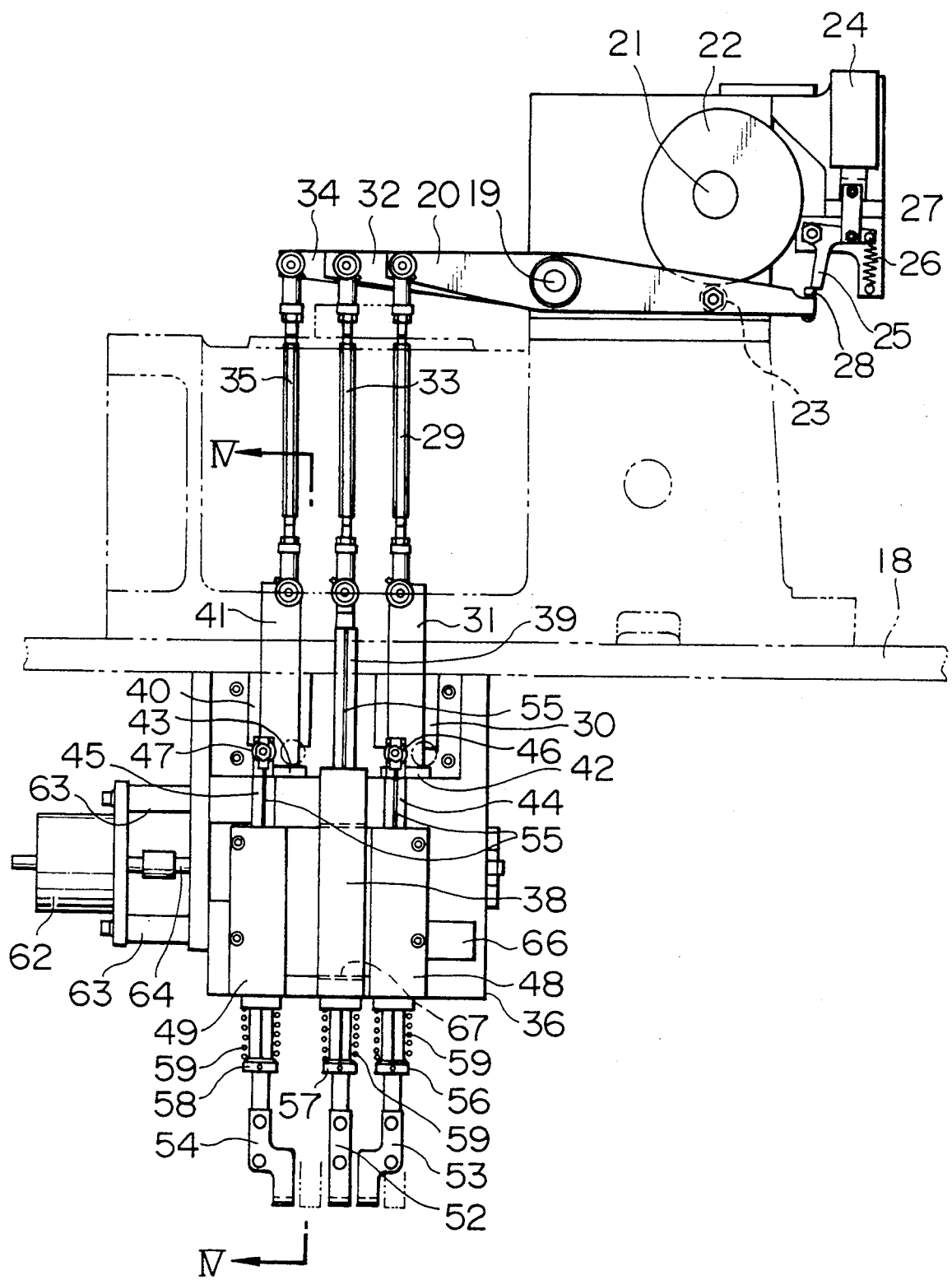
FIG. 3 is a side elevation of the parts mounter of FIG. 2 including the mechanisms of FIG. 1.

In FIGS. 1 and 3-5, a supporting table of a parts feeder is indicated at 18. An oscillating tape driving lever 20 is mounted on a pivot 19 fastened to the supporting table 18. The tape driving lever 20 has a cam follower indicated at 23 fastened thereto and engaging a bottom edge surface of a cam indicated at 22 mounted fixedly to a shaft indicated at 21 mounted rotatably to the supporting table 18. A solenoid indicated at 24 drives a plunger to reciprocate an L-shaped restraining lever indicated at 25 about a pivot indicated at 27 against the force of a tension spring indicated at 26. As shown in FIG. 3, the right-hand end of the tape driving lever 20 has a bolt indicated at 28 fitted thereinto. When the tension spring 26 has fully moved the restraining lever 25 clockwise in FIG. 3 after de-energization of the solenoid 24, the restraining lever 25 engages the head of the bolt 28 to restrain the counterclockwise movement of the tape driving lever 20. The left-hand end of the tape driving lever 20 has a vertical reciprocating rod indicated at 29 pivotally mounted thereon. The lower end of the vertical reciprocating rod 29 has a vertical bar indicated at 31 vertically reciprocating along a linear guide indicated at 30.

An oscillating tape driving lever indicated at 32 has a left-hand end on which a vertical reciprocating rod 33 is pivotally mounted. The lower end of the vertical reciprocating rod 33 has a spline shaft indicated at 39 extending coaxially with the vertical reciprocating rod 33. The tape driving lever 32 is pivotally mounted on the pivot 19. The right-hand side of the tape driving lever 32 has a cam follower (not shown) engaging a cam (not shown) mounted fixedly to the cam shaft 21 behind the cam 22 in the direction of a normal to the sight of FIG. 3 in the same manner as the right-hand side of the tape driving lever 20. The right-hand end of the tape driving lever 32 is engageable with the same restraint including a solenoid (not shown) as the restraint including the solenoid 24. A motor (not shown) rotating the indexing turntable 12 also rotates the cam shaft 21.

An oscillating tape driving lever indicated at 34 has a left-hand end on which a vertical reciprocating rod 35 is pivotally mounted. The tape driving lever 34 is pivotally mounted on the pivot 19. The right-hand side of the tape driving lever 34 has a cam follower (not shown) engaging a cam (not shown) mounted fixedly to the cam shaft 21 behind the cam 22 in the direction of a normal to the sight of FIG. 3 in the same manner as the right-hand side of the tape driving lever 20. The right-hand end of the tape driving lever 34 is engageable with the same restraint including a solenoid (not shown) as the restraint including the solenoid 24.

The underside of the supporting table 18 has a mounting plate 36 fastened thereto. The linear guide 30 is mounted to the mounting plate 36. A block indicated at 38 containing a ball spline (not shown) meshing a spline shaft 39 is mounted on the mounting plate 36. The spline shaft 39 passes vertically through the block 38. The same linear guide indicated at 40 as the linear guide 30 is mounted on the mounting plate 36 and guides a vertical reciprocating bar 41. The lower end of a vertical reciprocating rod 35 has the vertical reciprocating bar 41 fastened thereto and extending coaxially with the vertical reciprocating rod 35.

Figure 4:
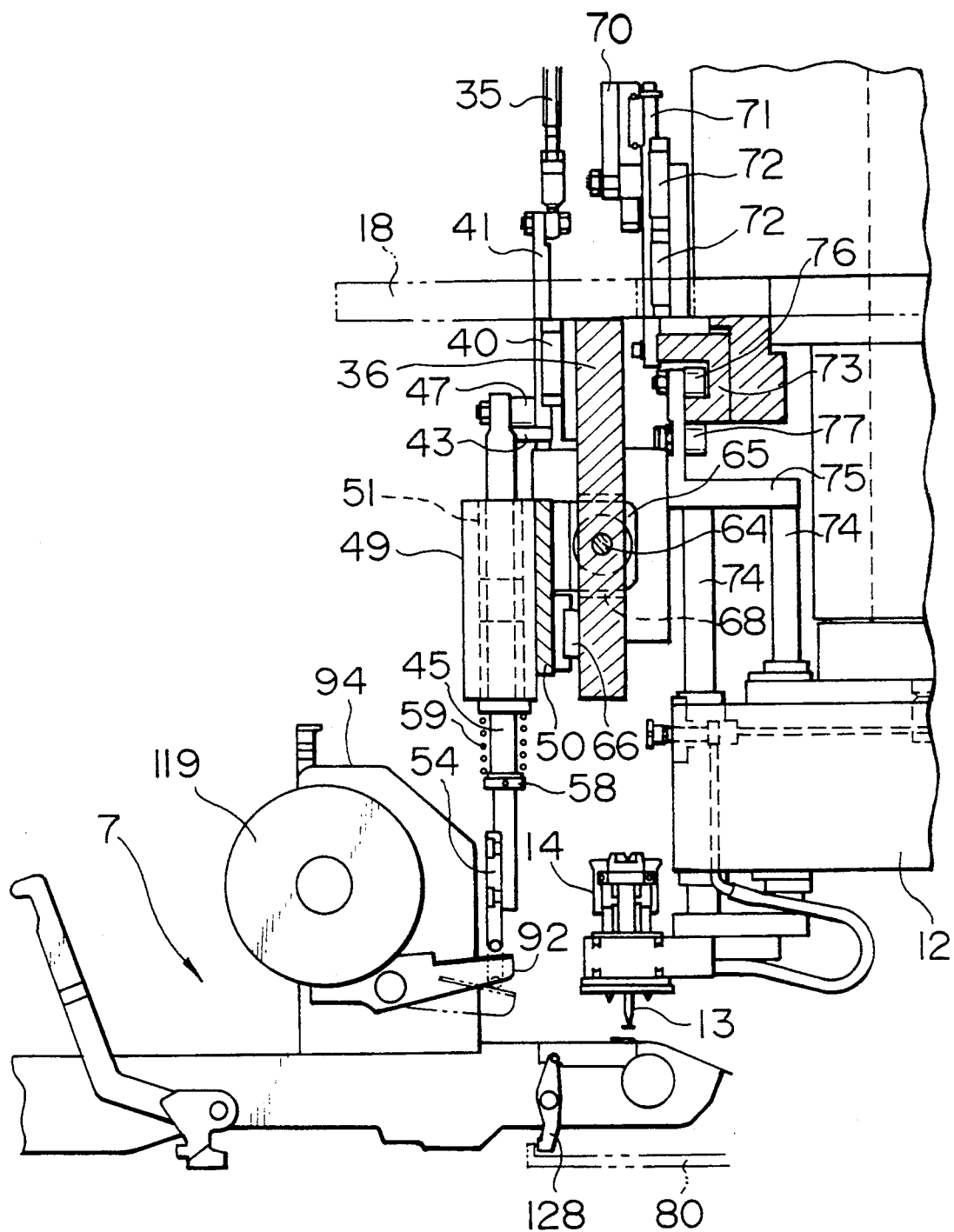
FIG. 4 is a sectional view taken along the line 4—4 in FIG. 3, showing the mechanisms of FIG. 1.
Figure 5:
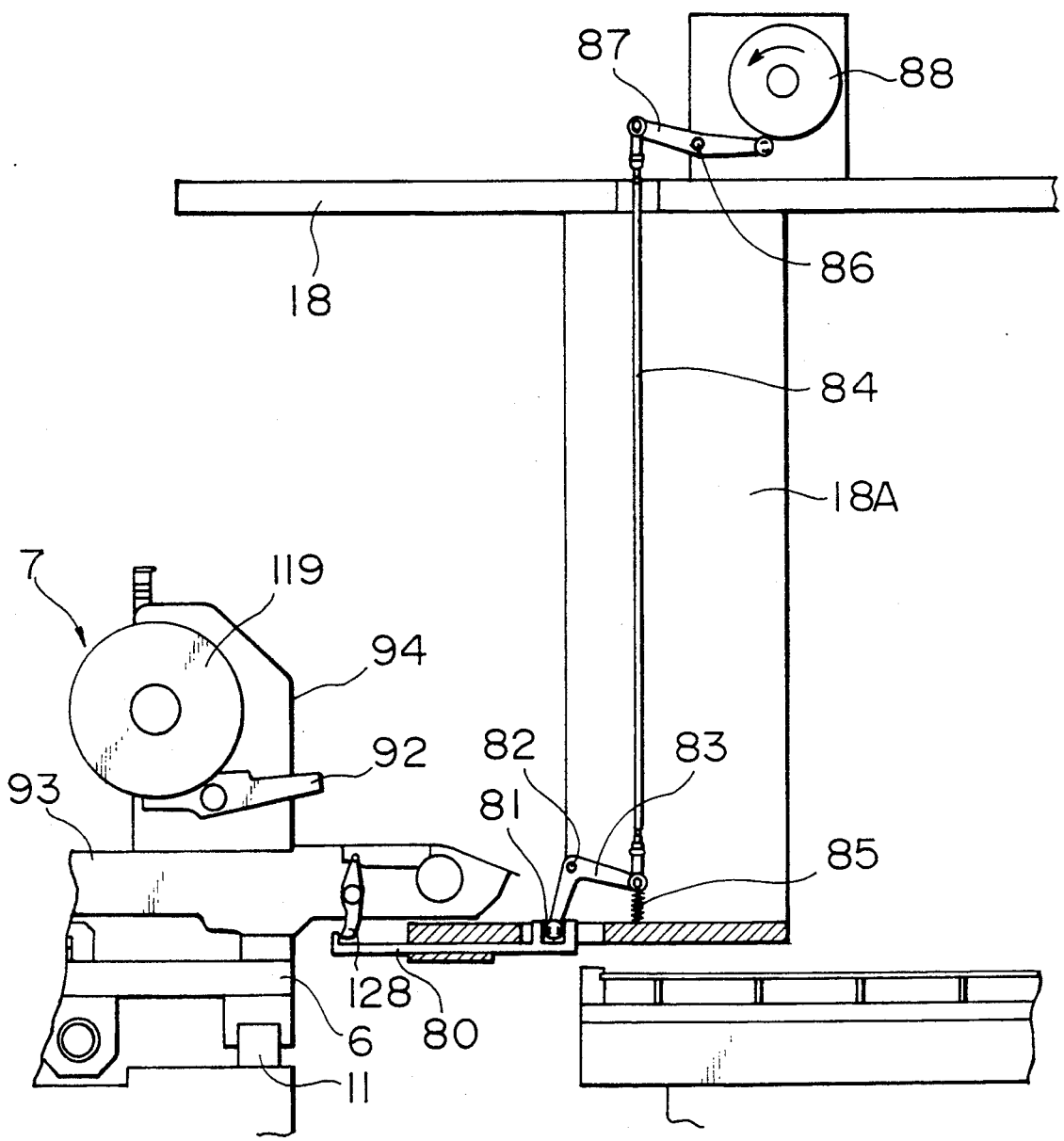
FIG. 5 is a sectional side elevation of a shutter drive provided outside parts feed units.

The lower ends of the respective vertical reciprocating bars 31 and 41 terminate in lateral tabs indicated at 42 and 43. Rollers indicated at 46 and 47 mounted atop spline shafts indicated at 44 and 45 ride on the lateral tabs 42 and 43 so that the vertical reciprocating bars 31 and 41 suspend the spline shafts 44 and 45. As shown in FIGS. 1 and 4, blocks indicated at 48 and 49 are mounted on a moving body indicated at 50. The block 48 contains a ball spline (not shown) meshing the spline shaft 44 which passes vertically through the block 48. The block 49 contains a ball spline 51 meshing the spline shaft 45 which passes vertically through the block 49.

Lower ends of the spline shafts 39, 44 and 45 have tape driving tips indicated at 52, 53 and 54 fastened thereto. Since each of the spline shafts 39, 44 and 45 has a rotational detent indicated at 55 extending therealong, the tape driving tips 52, 53 and 54 do not rotate. The tape driving tips 53 and 54 serve as tape feed drive means. Compression springs indicated at 59 are seated around the spline shafts 39, 44 and 45 between the undersides of the blocks 38, 48 and 49 and retainers 56, 57 and 58 mounted fixedly to the spline shafts 39, 44 and 45. The respective compression springs 59 urge the spline shafts 39, 44 and 45 downwards to urge the tape driving levers 20, 32 and 34 counterclockwise in FIG. 3 so that the respective cam follower 23 of the tape driving lever 20 and cam followers of the tape driving levers 32 and 34 engage the cams 22 and the other cams (not shown).

A motor indicated at 62 is supported by a laterally extending supports 63 on the mounting plate 36. The motor 62 drives a ball bearing screw shaft indicated at 64 to horizontally move a nut indicated at 65 meshing the ball bearing screw shaft 64. The moving body 50 to which the nut 65 is fastened moves along a linear guide indicated at 66 (see FIG. 4) between right and left in FIG. 3. The block 38 has a recess indicated at 67 allowing the moving body 50 to pass across the recess 67.

Movement of the moving body 50 causes the rollers 46 and 47 mounted atop the spline shafts 44 and 45 to travel along the lateral tabs 42 and 43 of the reciprocating bars 31 and 41 between right and left in FIG. 3. The rotational limit of the ball bearing screw shaft 64 and the widths of the lateral tabs 42 and 43 of the vertical reciprocating bars 31 and 41 are selected so that the travel distance of each of the rollers 46 and 47 is restricted to the extent between a position in solid line and a position in broken line shown in FIG. 3. When the rollers 46 and 47 are in the positions in broken lines, the tape driving tips 53 and 54 are in positions in two-dot chain lines as shown in FIG. 3.

The central tape driving tips 52 vertically reciprocates right above parts feed unit 7 positioned at a position of the suction of the part 4 by the feed table 6, to drive the parts feed unit 7 to dispense a carrying tape and a cover tape (described later). The peripheral tape driving tips 53 and 54 vertically reciprocate right above parts feed units 7 at locations positioned to opposite sides of the particular parts feed unit 7 positioned at the position of the suction of the part 4, to drive the two parts feed units 7 on opposite sides of the parts feed unit 7 at the position of suction to dispense their tapes.

A mechanism vertically reciprocating the parts sucking and mounting heads 14 at the suction station will be described hereinafter.

In FIGS. 1 and 4, vertical reciprocating rods indicated at 70 vertically reciprocating the parts sucking and mounting heads 14 have vertically reciprocating mechanisms (not shown) like the vertical reciprocating rod 29 has the vertically reciprocating mechanism including the tape driving lever 20 and the cam 22. Each vertical reciprocating rod 70 has a vertical reciprocating bar indicated at 71 fastened thereto. The vertical reciprocating rod 70 vertically reciprocates the vertical reciprocating bar 71 along a linear guide indicated at 72 fastened to the supporting table 18. The lower end of the vertical reciprocating bar 71 has a block 73 fastened thereto having a substantially U-shaped cross section.

A pair of reciprocating vertical shafts indicated at 74 have lower ends to which each parts sucking and mounting head 14 is fixedly mounted. The reciprocating vertical shafts 74 are arranged on a radius of the indexing turntable 12 and pass through the indexing turntable 12. The reciprocating vertical shafts 74 are fixed to an L-shaped roller mount indicated at 75, as shown in FIGS. 1 and 4. An upper cam follower indicated at 76 and a lower cam follower indicated at 77 are mounted to a vertical arm portion of the roller mount 75.

Figure 19:
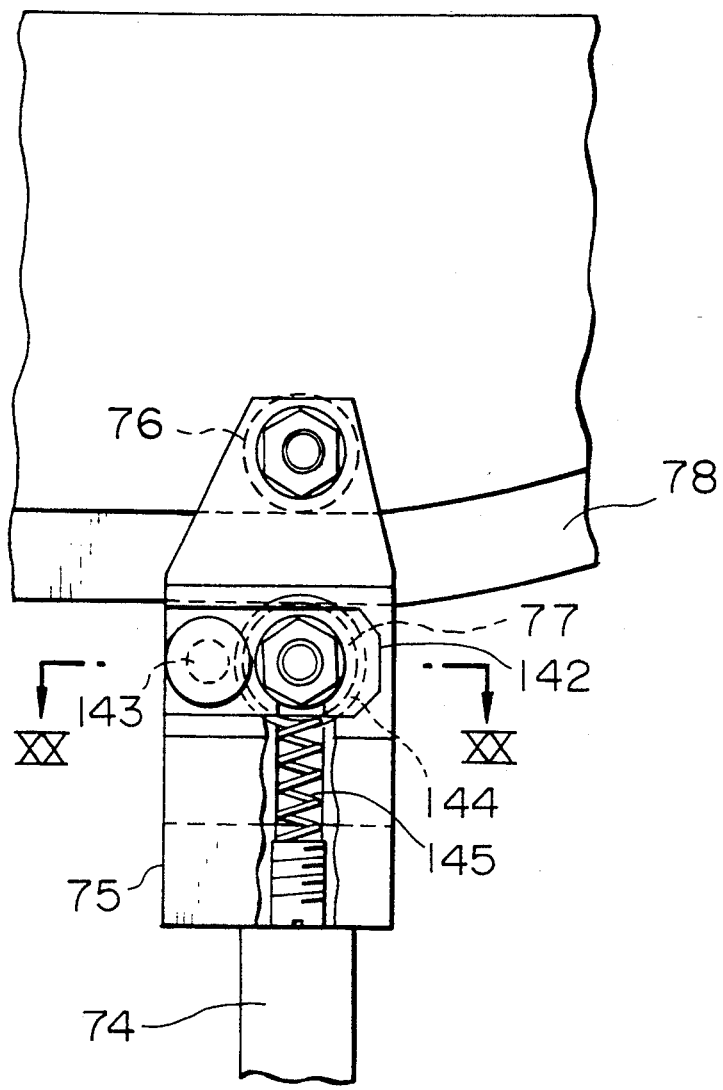
FIG. 19 is a cutaway side elevation of a cam system in which a pair of cam followers nips a cylindrical cam.
Figure 20:
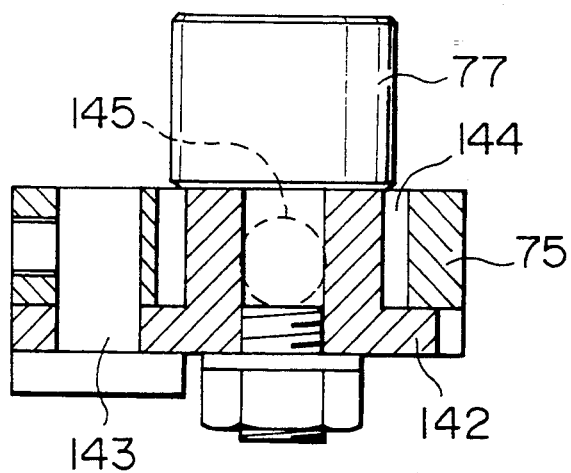
FIG. 20 is a sectional view taken along the line 20—20 in FIG. 19.

A structure of mounting the lower cam follower 77 will be described with reference to FIGS. 19 and 20. An oscillating bearing indicated at 142 rotatably bears the lower cam follower 77 and oscillates within a recess 144 defined in the roller mount 75 about a pivot indicated at 143 mounted on the roller mount 75. A compression spring indicated at 145 seated within a hole defined in the roller mount 75 urges the oscillating bearing 142 upwards.

As shown in FIG. 1, a cylindrical cam indicated at 78 is fixed to the supporting table 18 about the axis of the indexing turntable 12 provided under the supporting table 18. The upper cam follower 76 rides on the cylindrical cam 78 and suspends the roller mount 75 and therefore the parts sucking and mounting head 14. The compression spring 45 pushes the lower cam follower 77 on the underside of the cylindrical cam 78. The pair of upper and lower cam followers 76 and 77 nips the cylindrical cam 78.

Intermittent movement of the indexing turntable 12 rolls the upper and lower cam followers 76 and 77 along the cylindrical cam 78. Thus, each parts sucking and mounting head 14 travels upwards and downwards along the cylindrical cam 78 while being suspended by the cam follower 76. Since the cylindrical cam 78 is cut away and the block 73 at the suction station, the upper and lower cam followers 76 and 77 ride onto the block 73 from the cylindrical cam 78 as best shown in FIG. 4. The compression spring 145 pushing the lower cam follower 77 on the cylindrical cam 78 can absorb a vibration and an impact due to a dispersion in the size of the cylindrical cam 78.

When the reciprocating vertical rod 70 moves the block 73 downwards, the block 73 positively moves the roller mount 75, the shafts 74 and the parts sucking and mounting head 14 downwards since the compression spring 145 pushes the lower cam follower 77 on the underside of the block 73. A cam (not shown) rotates to lift the block 73 and the parts sucking and mounting head 14 up.

The same restraint (not shown) as the restraint comprising the solenoid 24 and the restraining lever 25 can restrain the upward movement of the reciprocating vertical rod 70.

As shown in FIGS. 1, 4, 5, 6, 7 and 12, a bar indicated at 80 is provided outside the parts feed units 7 and drives a shutter indicated at 126 (described later). An L-shaped oscillating lever indicated at 83 is mounted pivotally on a vertical mounting board indicated at 18A fastened to the supporting table 18. One end of the L-shaped oscillating lever 83 fits a recess indicated at 81 defined in one end of the shutter driving bar 80. The shutter driving bar 80 serves as shutter drive means. The L-shaped oscillating lever 83 oscillates about a pivot indicated at 82 so that the one end of the L-shaped oscillating lever 83 horizontally reciprocates the shutter driving bar 80. The other end of the L-shaped oscillating lever 83 is connected pivotally with the lower end of a reciprocating vertical rod indicated at 84 and is connected with one end of a tension spring indicated at 85. The other end of the tension spring 85 is fastened to the mounting board 18A. The upper end of the reciprocating vertical rod 84 is connected pivotally with one end of an oscillating lever indicated at 87 which is pivotally supported on a pivot indicated at 86 fixed to the supporting table 18. The other end of the oscillating lever 87 has a roller in press contact with the edge of cam indicated at 88 by the force of the tension spring 85. Thus, rotation of the cam 88 vertically reciprocates the reciprocating vertical rod 84 which in turn oscillates the L-shaped oscillating lever 83 to horizontally reciprocate the shutter driving lever 80. A common motor (not shown) rotates the cams 22 and 88 so as to rotate at an equiangular speed. Alternatively, separate motors may rotate the cams 22 and 28.

Figure 6:
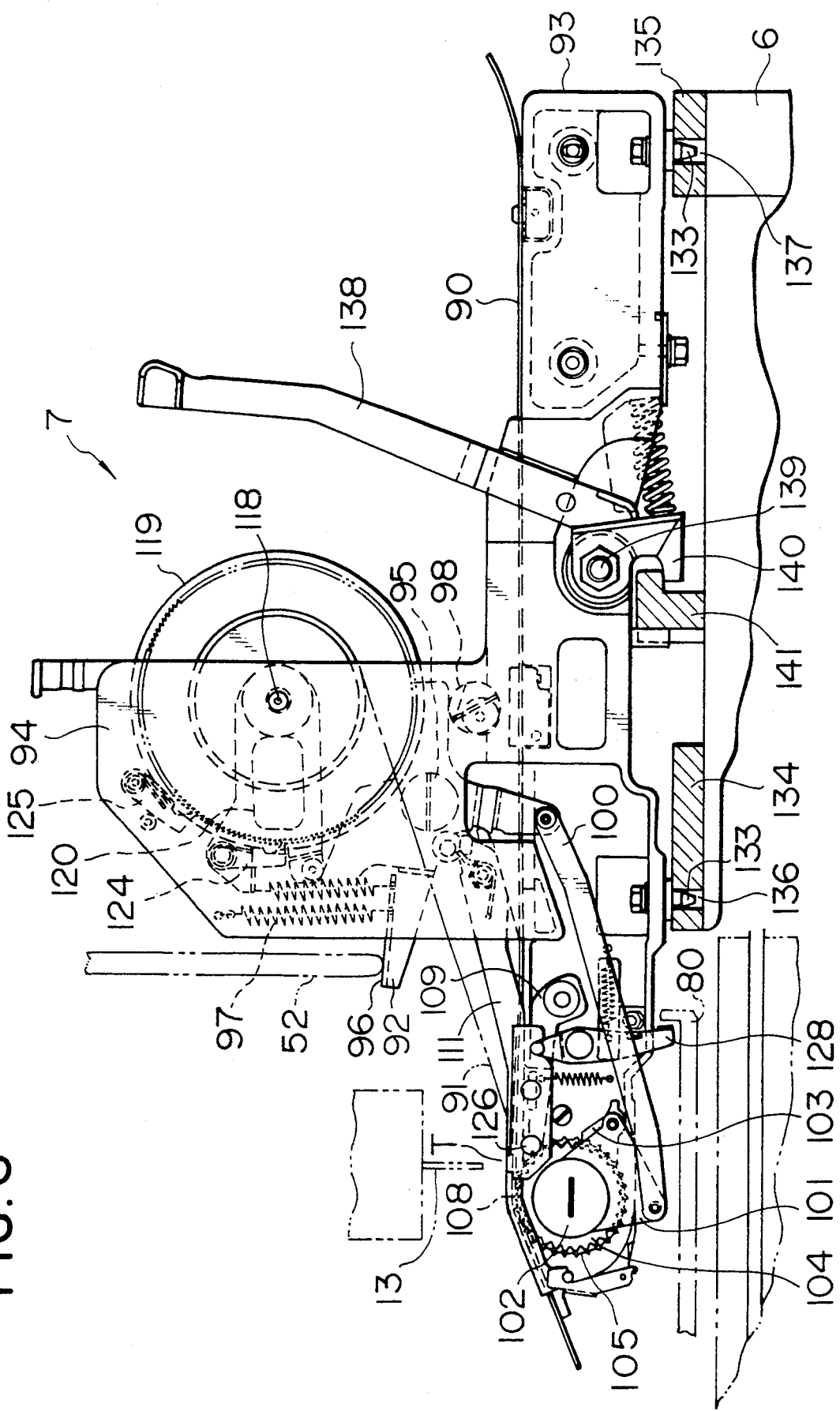
FIG. 6 is a sectional side elevation of a parts feed unit.
Figure 12:
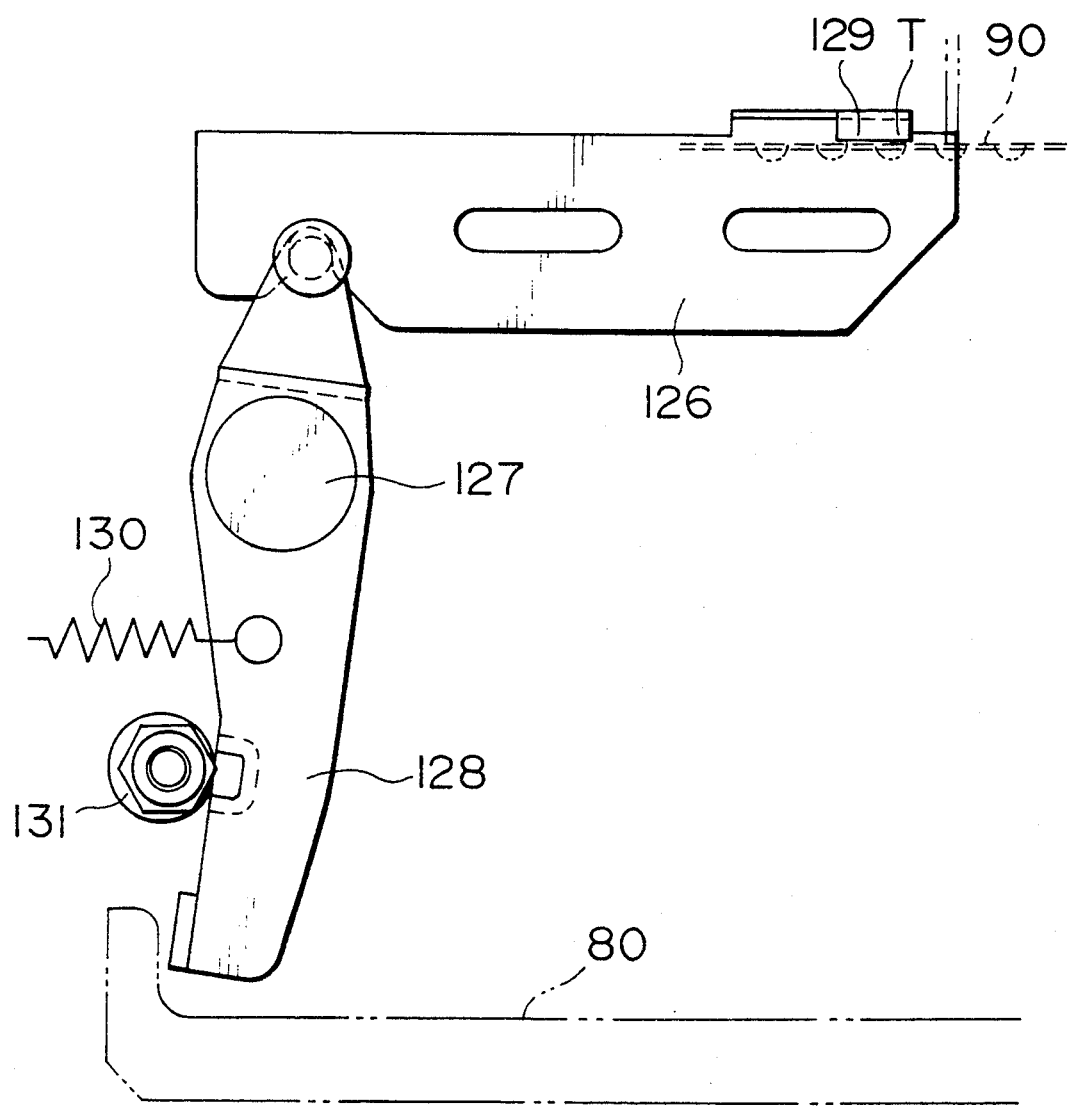
FIG. 12 is a side elevation of the shutter, a shutter drive of the parts feed unit and the shutter drive provided outside the parts feed units.

The parts feed unit 7 will be described later. As shown in FIGS. 6 and 12, a carrying tape indicated at 90 carries one kind of parts 4 spaced at a fixed pitch therealong. A cover tape indicated at 91 is attached to the upper surface of the carrying tape 90 to prevent the parts 4 from escaping from the carrying tape 90.

The parts feed unit 7 intermittently dispenses the tapes 90 and 91 at the fixed arrangement pitch of the parts 4 to feed the parts 4 to a position of a dispensation T.

Figure 7:
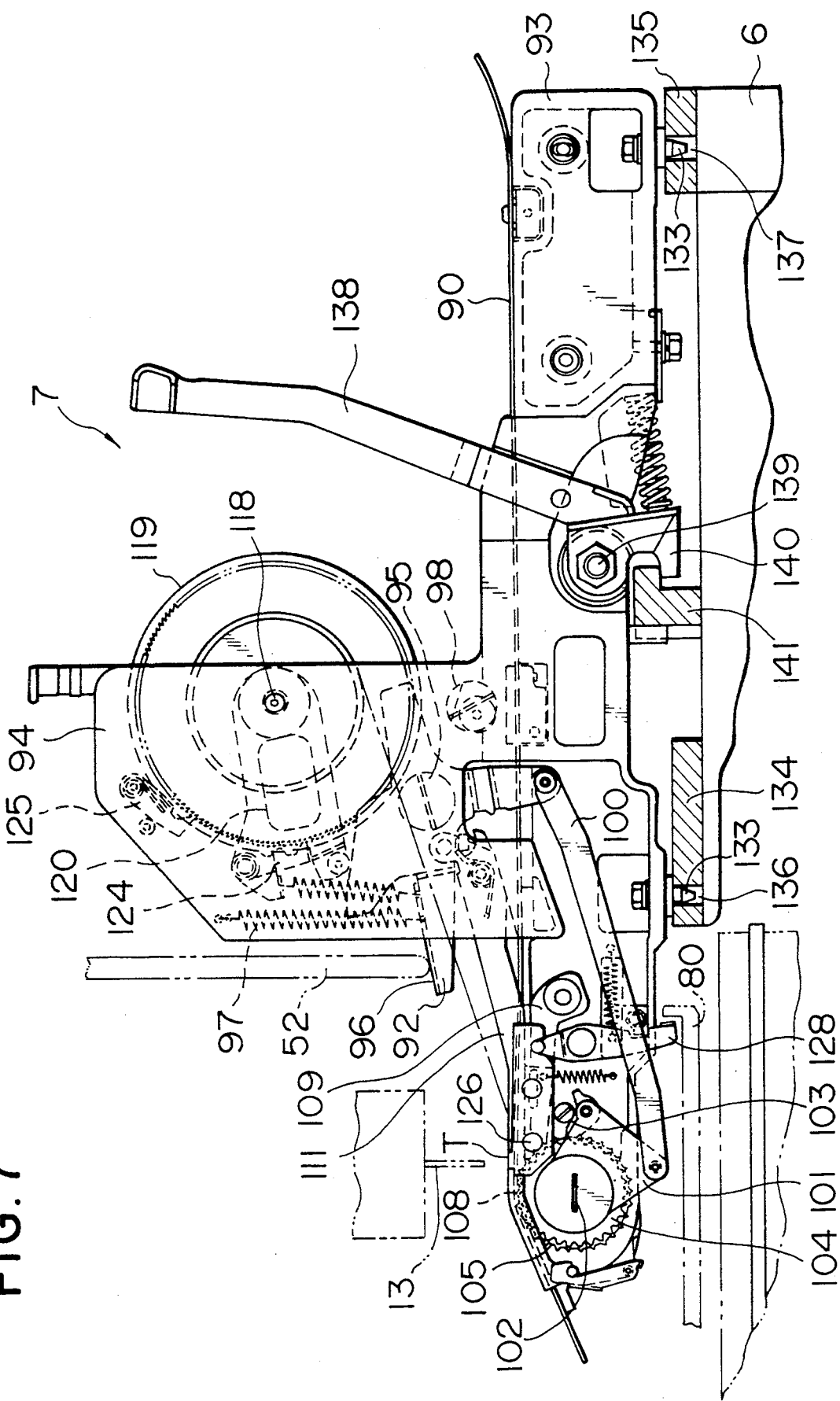
FIG. 7 is a sectional side elevation of the parts feed unit.

As shown in FIGS. 1 and 4–12, a generally cruciform oscillating lever indicated at 92 is mounted about a pivot 95 on an erect cassette sidewall indicated at 94 and constitutes part of a drive feeding the tapes 90 and 91. As shown in FIGS. 6 and 7, the tape driving tip 52, 53 or 54 depresses an engaging portion 96 of the oscillating lever 92 to move the oscillating lever 92 from a position shown in FIG. 6 to a position shown in FIG. 7. On the other hand, when the tape driving tip 52, 53 or 54 moves upwards from the position shown in FIG. 7 to the position shown in FIG. 6, a tension spring 97 seated between the engaging portion 96 and the cassette sidewall 94 rotates the oscillating lever 92 from the position shown in FIG. 7 to the position shown in FIG. 6.

A tape feeding means for feeding the tapes 90 and 91 so that the parts 4 held on the carrying tape 90 are positioned at the position of the dispensation T of the parts 4 will be described with reference to FIGS. 6–9 hereinafter.

The bottom end of the oscillating lever 92 is connected pivotally with one end of a connecting bar indicated at 100. The other end of the connecting bar 100 is connected pivotally with one end of a trapezoidal tape feed lever indicated at 101. The tape feed lever 101 is mounted pivotally on the cassette body 93 of the parts feed unit 7 so as to oscillate about a pivot 102. A counterclockwise movement of the oscillating lever 92 to counterclockwise move the tape feed lever 101 so that a claw indicated at 103 mounted pivotally on the other end of the tape feed lever 101 meshes a feed gear wheel indicated at 104 mounted on the pivot 102 and feeding the tapes 90 and 91 and rotates the gear wheel 104 by a predetermined angle counterclockwise in FIGS. 6, 7 and 9. The feed gear wheel 101 has a sprocket wheel indicated at 105 integrally mounted thereto. The teeth or pins 108 of the sprocket wheel 105 engage with perforations (not shown) in the carrying tape 90 dispensed by a reel indicated at 107 and travelling on a flat shoot surface indicated at 106 defined on the top surface of the cassette body 93. A clockwise rotation of a predetermined angle of the gear wheel 104 feeds the carrying tapes 90 and 91 by a predetermined number of pitches to left in FIG. 6 (to right in FIG. 1) to position a part 4 arranged at the front of a series of parts 4 on the carrying tape 90 at the position of the dispensation T in front of a position at which the sprocket 105 starts meshing perforations in the carrying tape 90. A claw-shaped detent indicated at 109 is urged counterclockwise in FIGS. 6 and 7 by a tension spring 110 and engages the teeth of the gear wheel 104 to prevent the gear wheel 104 from a clockwise movement.

Figure 10:
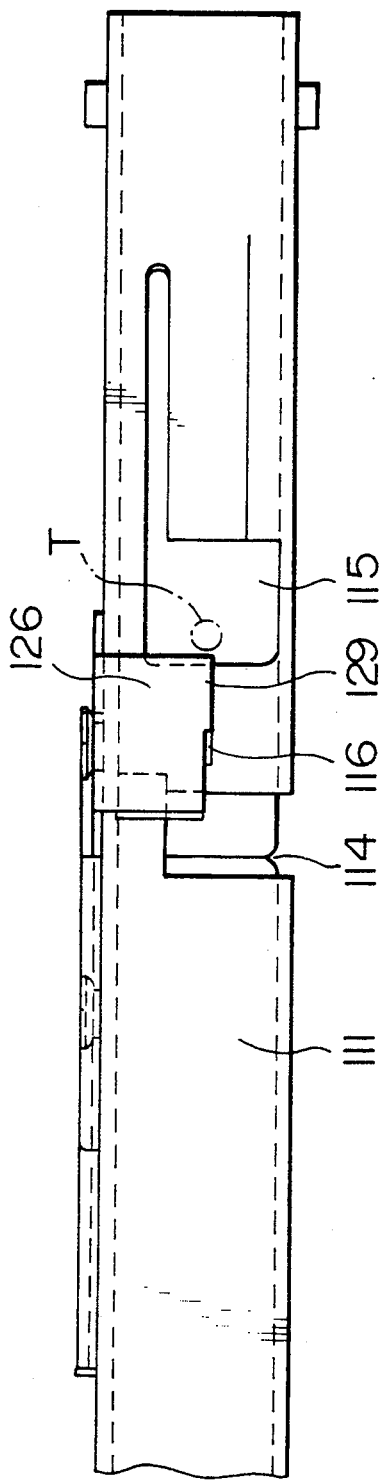
FIG. 10 is a plan view of a suppressor, showing a shutter in open position.
Figure 11:
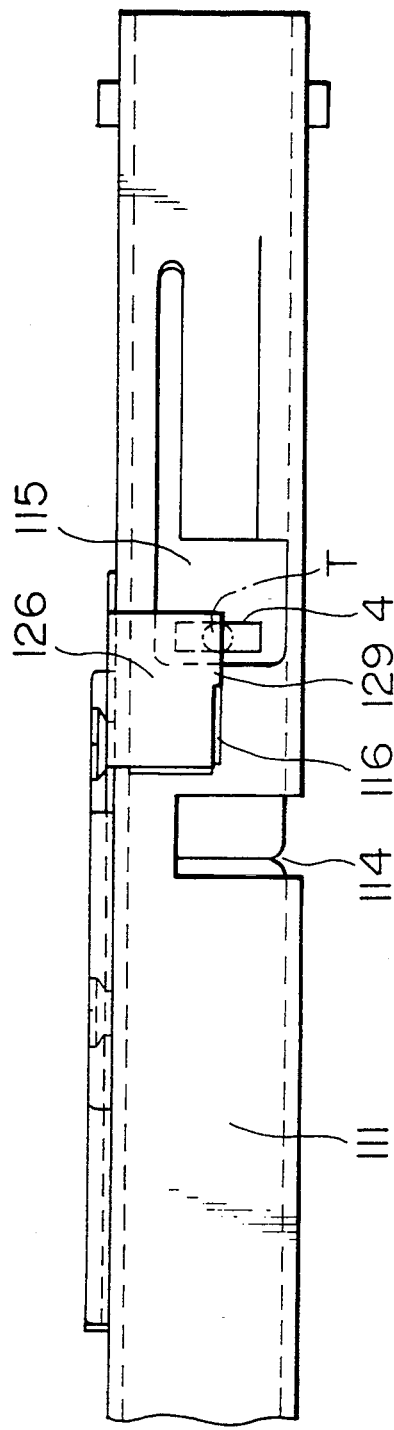
FIG. 11 is a plan view of a suppressor, showing the shutter in operating position.

As shown in FIGS. 6–12, a suppressor 111 is mounted on the cassette sidewall 94 by means of a pivot 112. As best shown in FIGS. 10 and 11, an intermediate portion of the suppressor 111 has a notch 114 for peeling the cover tape 91 off the carrying tape 90 before the position of the dispensation T. As best shown in FIGS. 10 and 11, the suppressor 111 has an opening 115 surrounding the position of the dispensation T opposite to the notch 114. The teeth of the sprocket wheel 104 projecting upwards out of the opening 115. The suppressor 111 has a slit 116 extending lengthwise of the suppressor 111 between the notch 114 and the opening 115 behind the position of the dispensation T in the direction of the feed of the carrying tape 90. A take-up reel 119 is supported by a shaft 118 on the cassette sidewall 94 and takes up the cover tape 91 peeled off the carrying tape 90.

Figure 8:
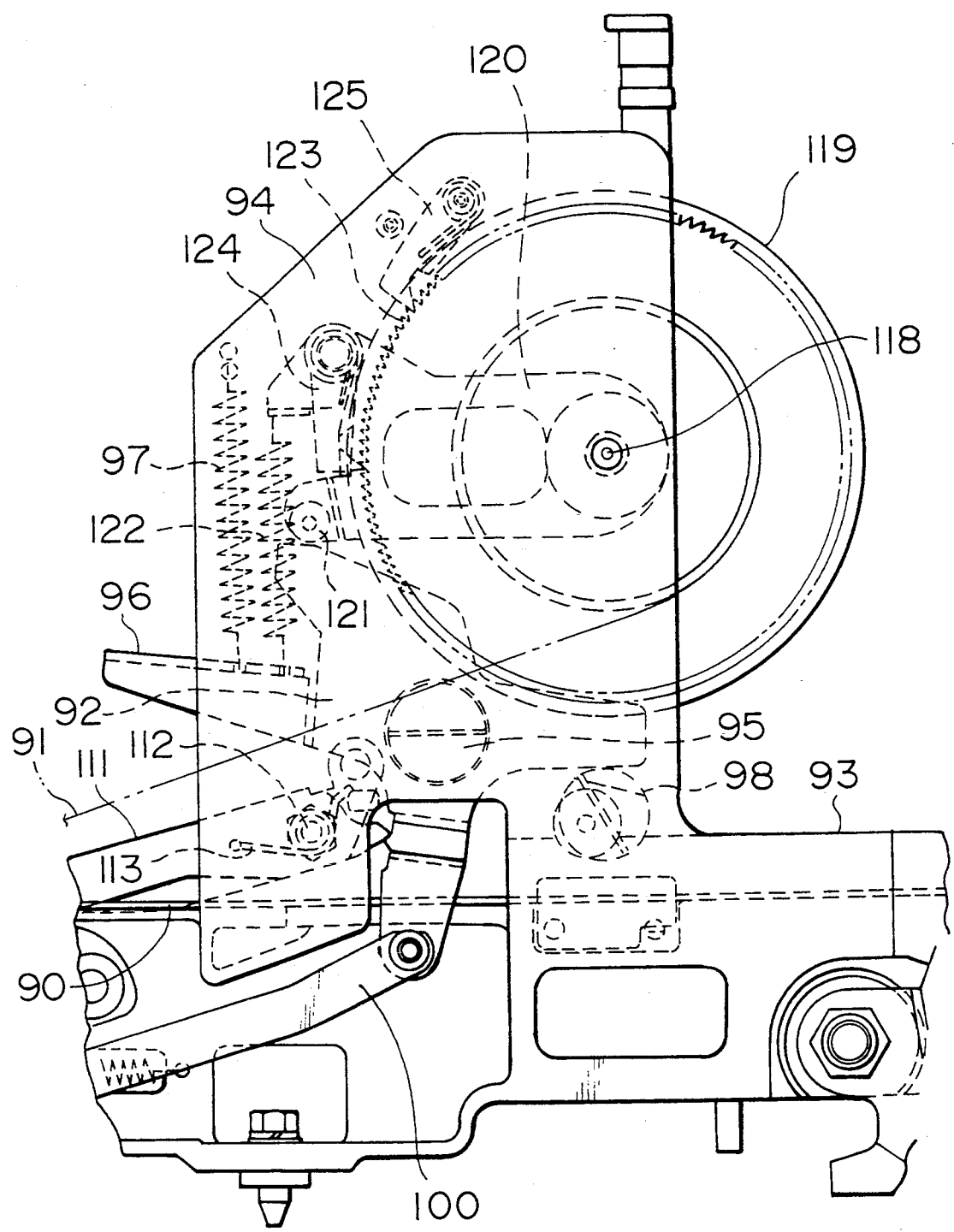
FIG. 8 is a side elevation in an enlarged scale of a main part of the parts feed unit.
Figure 9:
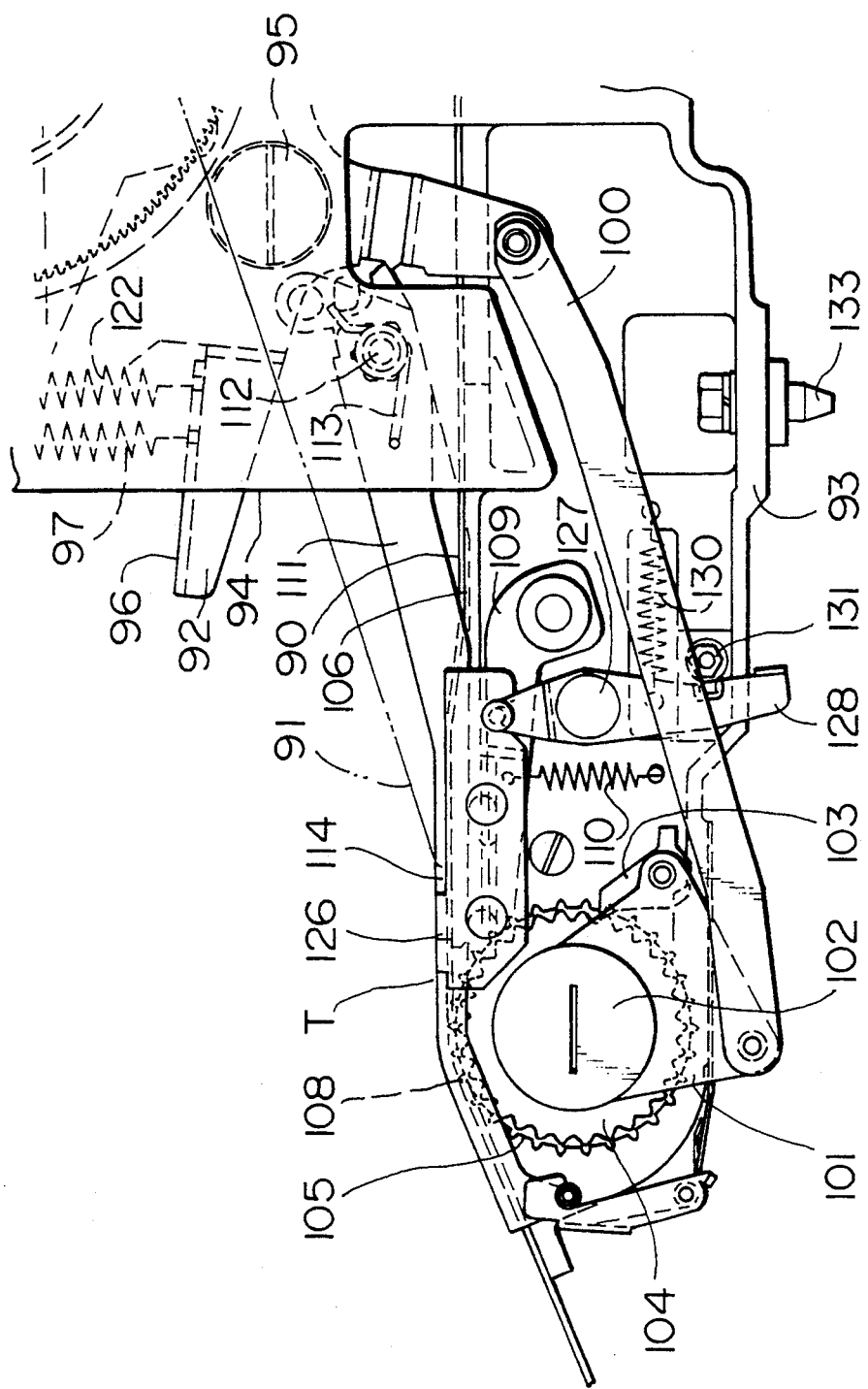
FIG. 9 is a sectional side elevation in an enlarged scale of a main part of the parts feed unit.

A drive for the take-up reel 119 will be described hereinafter. As best shown in FIG. 8, a ratchet lever 120 is mounted pivotally on the shaft 118. The bottom portion of a free end of the ratchet lever 120 has a roller 121. A tension spring 122 connecting the free end of the ratchet lever 120 and the engaging portion 96 of the oscillating lever 92 presses the roller 121 on the upper bar portion of the oscillating lever 92. The top portion of the free end of the ratchet lever 120 has a pawl 124 mounted pivotally thereon. The pawl 124 engages a ratchet wheel 123 formed integrally to the take-up reel 119. Once downward movement of the tape driving tip 52 moves the oscillating lever 92 counterclockwise as shown in FIGS. 6–9, the ratchet lever 120 is rotated counterclockwise to counterclockwise rotate the take-up reel 119 so that the take-up reel 119 takes up the peeled cover tape 91. A backstopping pawl indicated at 125 engages the ratchet wheel 123 to prevent a reverse rotation of the take-up reel 119. An edge of the notch 114 and the drive for the take-up reel 119 constitute a means for peeling the cover tape 91 off the carrying tape 90.

As shown in FIGS. 6, 7 and 9–12, a shutter indicated at 126 is mounted slidably to the suppressor 111 and prevents an escaping of a part 4 out of the carrying tape 90. A shutter operating lever indicated at 128 oscillates about a pivot indicated at 127 mounted on the cassette body 93 to reciprocate the shutter 126 above the carrying tape 90 in the direction of the feed of the carrying tape 90. The horizontal reciprocation of the above-described shutter driving bar 80 engaging the lower end of the shutter operating lever 128 and the force of a tension spring indicated at 130 having one end attached to a lower portion of the shutter operating lever 128 under the position of the pivot 127 oscillate the shutter operating lever 128. As shown in FIGS. 6, 11 and 12, a suppressing tab 129 (see FIGS. 10–12) bent downwards at the top of the shutter 126 is positioned close to the top surface of an uncovered part 4 a space above which is shut by the shutter 126, to prevent an escape of the uncovered part 4 while the carrying tape 90 is fed and the feed table 6 is moved.

Only when the suckers 13 descends and then sucks the part 4, the shutter driving bar 80 moves to left in FIG. 6, and the shutter 126 and therefore the suppressing tab 129 move to left in FIG. 11 within in the slit 116 to open the space above the uncovered part 4 positioned at the position of the dispensation T. As shown in FIG. 12, a stop or positioner indicated at 131 stops the clockwise movement of the shutter driving lever 128 to position the shutter 126 above the position of the dispensation T against the force of the tension spring 130.

Figure 13:
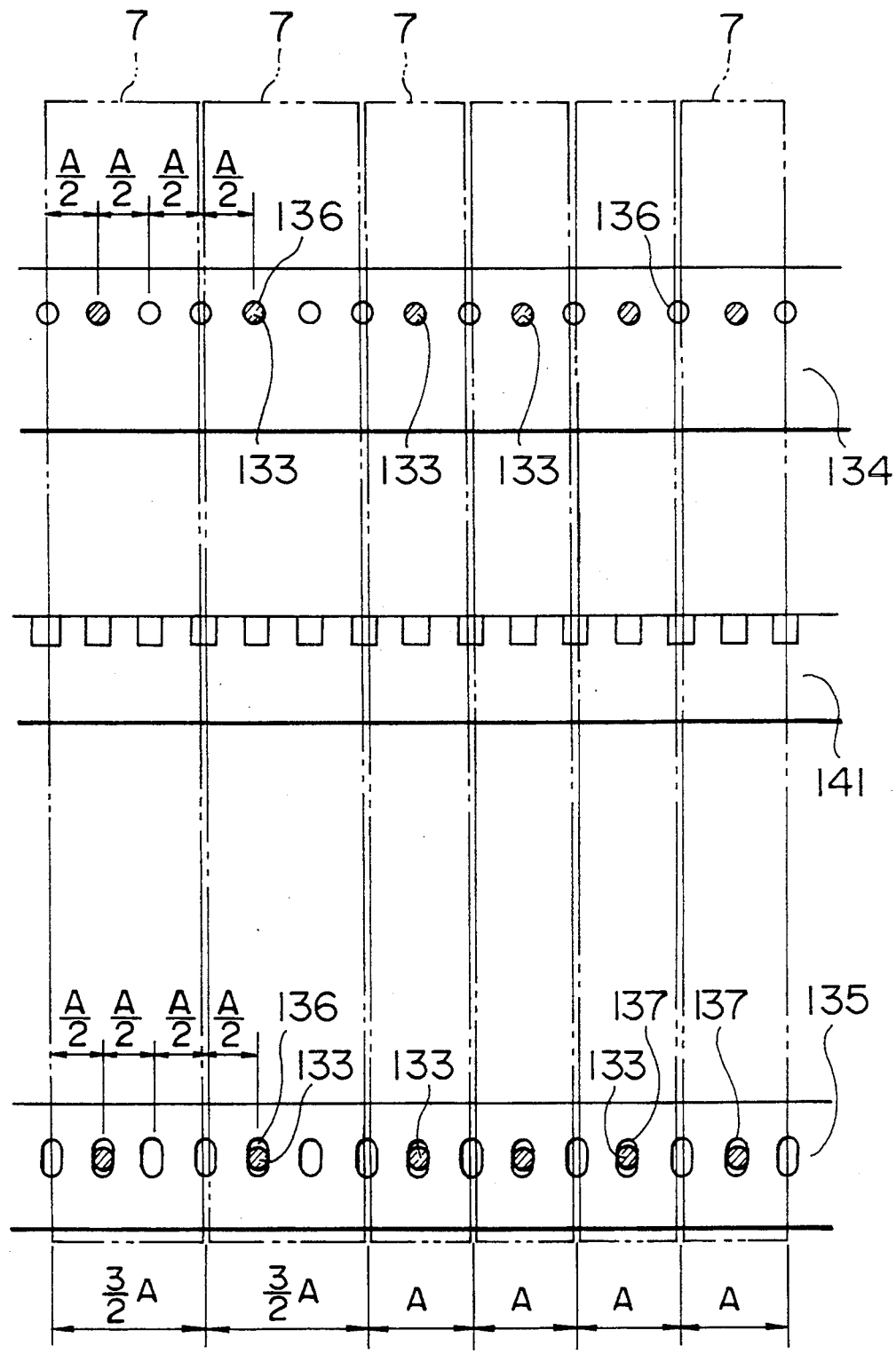
FIG. 13 is a plan view of an arrangement of the parts feed units on a feed table.

A mount of the parts feed units 7 on the feed table 6 will be described with reference to FIGS. 6 and 13. As best shown in FIG. 13, two locating pins indicated at 133 are mounted to forward and rearward parts of the bottom of the cassette body 93 of each parts feed unit 7. An insertion of the locating pins 133 into a circular locating hole 136 defined in a front mounting bar 134 of the feed table 6 and an elliptic locating hole 137 defined in a rear mounting bar 135 of the feed table 6 locates the parts feed unit 7 on the feed table 6. A locking lever indicated at 138 (see FIGS. 6 and 7) is mounted on a pivot indicated at 139. A locking claw 140 at the bottom end of the locking lever 138 can engage a locking plate 141 fastened to and erected from the upper surface of the feed table 6 to lock the parts feed unit 7 to the feed table 6. As shown in FIG. 13, the locating holes 136 and 137 are spaced at a pitch of ½ of A lengthwise of the feed table 6.

There are a plurality of widths of parts feed units 7 lengthwise of the feed table 6. For example, when all of parts feed units 7 arranged lengthwise of the feed table 6 have a pitch of A, i.e., a center-to-center distance between every second locating pins 136 or 137, every second locating holes 136 and 137 are used. The pitch of A is the narrowest arrangement pitch for used parts feed unit 7. The second narrowest pitch of used parts feed unit 7 is 3/2 of A. When all of parts feed units 7 arranged lengthwise of the feed table 6 have the pitch of 3/2 of A, every third locating holes 136 and 137 are used. As seen in FIG. 13, parts feed units 7 having the pitches of A and 3/2 of A can be arranged with the narrowest spacing even if they are arranged in any order. Therefore, the engaging portions 96 of the oscillating levers 92 are arranged with pitches of A and 3/2 of A. The parts feed units 7 may alternatively be arranged at other pitches of A times numbers except integers.

In the present embodiment of the invention, the pitch of A is 17 mm, the narrowest width of the used parts feed units 7 is 16.5 mm and the second narrowest width of the used parts feed units 7 is 23 mm. When only parts feed units 7 having the width of 16.5 mm are arranged on the feed table 6 with almost no spacing and the tape driving tip 52 is positioned right above a parts feed unit 7, the moving body 50 horizontally moves the tape driving tip 53 to the position in the two-dot chain lines shown in FIG. 3, i.e., position above a second parts feed unit 7 to right in FIG. 3 from the parts feed unit 7 right below the tape driving tip 52.

Figure 14:
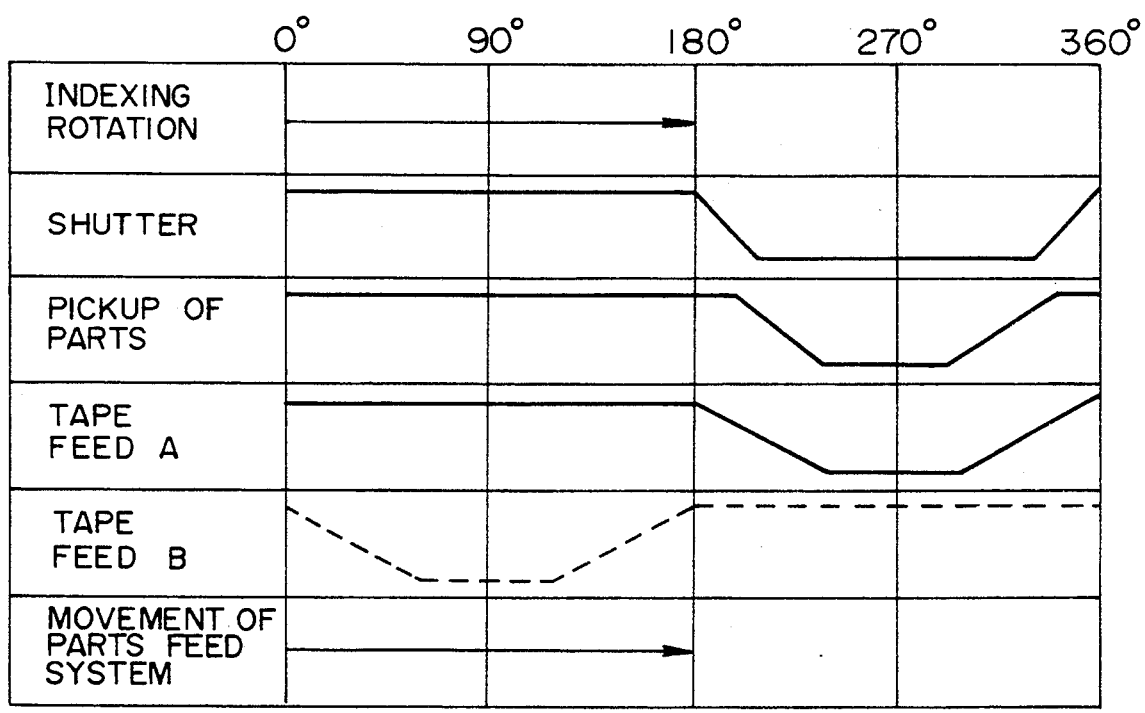
FIG. 14 is a timing chart indicative of the operations of main parts of a parts feeder according to the present invention.

The moving body 50 also horizontally moves the tape driving tip 54 to the position in the two-dot chain lines shown in FIG. 3, i.e., position above a second parts feed unit 7 to left in FIG. 3 from parts feed unit 7 right below the tape driving tip 52. FIG. 14 is a timing chart of operations of main parts of the parts feeder driven by cams. The axis of abscissa represents angles of rotation of the cam shaft 21, the cam 88 and other main parts. The operation of each of these cams and these main parts has a cycle of 0° to 360°. As shown by a timing chart of indexing rotation in the top row of the timing chart of FIG. 14, the parts sucking and mounting head 14 moves from a working station to a next working station as the indexing turntable 12 rotates from 0° to 180°. As shown by the timing chart of a parts feed system including the feed table 6 in the bottom row, the feed table 6 and the moving body 50 move during the indexing rotation of 0° to 180° The indexing turntable 12, the feed table 6 and the moving body 50 continue staying from 180° to 360° As shown by the timing chart of operation of the shutter in the second top row, the shutter driving bar 80 is in the position shown in FIG. 6 while the cam 88 rotates from 0° to 180° From 180° to 360° the shutter driving bar 80 drives the shutter 126 leftward in FIG. 6 (to right in FIG. 5) to open the space above the position of the dispensation T and then drives the shutter 126 rightward in FIG. 6 to shut this space. In the timing chart the of the shutter, a first oblique line indicates that the shutter 126 is opening and the second oblique line indicates that the shutter 126 is shutting.

As shown by the timing chart of the pickup of a part of in the third top row the timing chart, the parts sucking and mounting head 14 is in an elevated position from 0° to 180° while moving to the suction station, and moves downwards to the position T of the suction of the part 4 after the parts sucking and mounting head 14 have arrived at the suction station. After sucking the part 4, the parts sucking and mounting head 14 moves upwards back to the initial elevated position. As seen in FIG. 14, the parts sucking and mounting head 14 completes the upward and downward movements while the shutter 126 stays at the open position.

The timing chart of a tape feed A in the fourth top row represents the movements of the tape driving tips 53 and 54. The tape driving tips 53 and 54 stay at elevated positions from 0° to 180°. They move downwards to depress the oscillating lever 92 so that the oscillating lever 92 enables the feed of the tapes 90 and 91, and move back to the elevated positions from 180° to 360°.

The timing chart of a tape feed B in the fifth top row represents the movement of the central tape driving tip 52. The central tape driving tip 52 moves downwards and upwards from 0° to 180° and stays at the elevated position from 180° to 360°. The first oblique line of this chart indicates that the central tape driving tip 52 is moving downwards. The second oblique line of this chart indicates that the central tape driving tip 52 is moving upwards. As seen in FIG. 14, while the central tape driving tip 52 moves downwards and upwards from 0° to 180°, the feed table 6 continues staying. The cams 22 and 88 have different phases of rotation and rotate at an equiangular speed so that the shutter 126 opens and shuts faster than the tape driving tips 53 and 54 move downwards. Therefore, the tape feed system can stably feed the tapes 90 and 91 at a lower speed than the shutter 126 opens and shuts the space above the position of the dispensation T. The profiles of the cams 22 and 88 are designed to appropriately control the speeds and accelerations of the shutter 126 and the tape feed system. Especially, the operation of the tape feed system is stabilized so that it always accurately positions the parts 4 at a predetermined position (position of the dispensation T). It is very difficult that the tape feed system feeds the tapes 90 and 91 at high speed using a cam having a highly accurate profile since acceleration is increased at a rate of square of speed. For example, if the tape feed system feeds the tapes 90 and 91 at a speed twice as much as the speed of a previous tape feed, a four time force is applied to the tapes 90 and 91, so that perforations in the carrying tape 90 may be broken or extended or the inertia of the tape feed system may cause the part 4 to go beyond the position of the dispensation T.

There is no problem if the speed of the shutter 126 is not controlled. Therefore, the feed table 6 may alternatively start when the shutter 126 does not fully open the space above the position of the dispensation T.

In operation, an operator arranges corresponding parts feed units 7 on the feed table 6 by the kind of the printed circuit board 5 on which parts 4 are to be mounted, inserts locating pins 133 into the locating holes 136 and 137 to locate all of the parts feed units 7, and engages the locking claw 140 with the locking plate 141 by means of the locking lever 138 to lock the parts feed units 7 to the feed table 6. The parts feed units 7 are arranged at the pitch of A or 3/2 of A by the widths of the parts feed units 7 so that some of adjacent parts feed units 7 are arranged with almost no spacing as shown in FIG. 13. Thus, a setup of the parts feeder for mounting the parts 4 on the printed circuit board 5 by means of the sucking and mounting heads 14 has been completed.

The feed and the mount of the parts 4 of the parts feeder will be described hereinafter.

Operator pushes a start switch provided on a control panel (not shown) to start an automatic operation of the parts feeder. The motor 3 moves to move the feed table 6 so that parts feed units 7 dispensing predetermined parts 4 are moved along the linear guide 11 by means of the ball bearing screw shaft 9 and the nut 10 to the position of the suction of the parts in the suction station at which the parts sucking and mounting head 14 which has been waiting sucks the parts 4. Throughout the movement of the feed table 6, the shutter driving bar 128 is in the operating position as shown in FIG. 6 and the shutter 126 is in the operating position best shown in FIG. 11 to shut the space above the position of the dispensation T. In this state, the cover tape 91 is in a peeled position and the suppressing tab 129 suppresses a part 4 held by the carrying tape 90.

Figure 15:
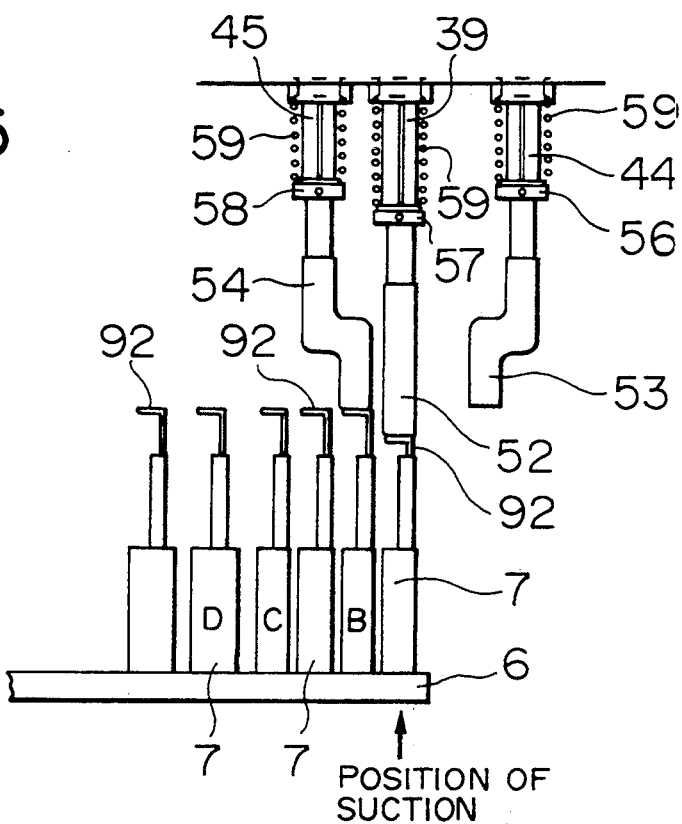
FIG. 15 is a front elevation of the tape driving tips, showing a tape dispensation out of a parts feed unit at a position of suction.

When the parts feed units 7 are positioned as shown in FIG. 15, the solenoid is energized to allow the oscillating lever 32 to be counterclockwise rotated. As shown in FIG. 14, the cam mounted fixedly to the cam shaft 21 counterclockwise rotates the oscillating lever 32 from 0° to 180° in accordance with the timing chart of the tape feed B. Thereby, the vertical reciprocating rod 33, the spline shaft 39 and the tape driving tip 52 are together moved downwards. The tape driving tip 52 depresses the engaging portion 96 of the cruciform oscillating lever 92 as shown in FIG. 15. The oscillating lever 92 is rotated counterclockwise from the position shown in FIG. 6 to the position shown in FIG. 7 to counterclockwise rotate the feed lever 101 as shown in FIG. 7 by means of the connecting bar 100. Thereby, the claw 103 drives the gear wheel 104 and therefore the sprocket wheel 105. The teeth 108 of the sprocket wheel 105 feed the tapes 90 and 91 by the predetermined pitches. During the feed of the tapes 90 and 91, the suppressor 111 continues suppressing the carrying tape 90 from being elevated.

The oscillating lever 92 is moved counterclockwise as shown in FIG. 7 to allow the tension spring 122 to rotate the ratchet lever 120 counterclockwise in FIG. 8 and the pawl 124 engages the ratchet wheel 123 and rotates the take-up reel 119 by the predetermined angles counterclockwise in FIG. 8. The take-up reel 119 is rotated to peel the cover tape 91 off the carrying tape 90 in the notch 114 defined in the suppressor 111 and takes up the peeled cover tape 91. In this state, the suppressor 111 and the suppressing tab 129 of the shutter 126 cover the space above the uncovered part 4 held by the carrying tape 90 to suppress the uncovered part 4 as best shown in FIG. 11, and the solenoid 24 and the solenoid (not shown) restraining the oscillating lever 34 are de-energized, and the tension spring 26 engages the restraining lever 25 with the oscillating lever 20 to restrain the tape driving lever 20, and the tension spring (not shown) also restrains the tape driving lever 34.

When the tape driving tip 52 is moved upwards, the tension spring 97 moves the oscillating lever 92 clockwise as seen in FIGS. 6 and 7 to interrupt the feed of the carrying tape 90 and the peeling of the cover tape 91 and position a next part 4 to be sucked at the position of the suction of the part 4.

From 0° to 180° in the timing chart of FIG. 14, the indexing turntable 12 rotates a parts sucking and mounting head 14 to suck the next part 4 through 180° to the suction station while the cam followers 76 and 77 nip the cylindrical cam 78. When the parts sucking and mounting head 14 has reached the suction station, the cam followers 76 and 77 has ridden onto the block 73 from the cylindrical cam 78. During the travelling of the cam followers 76 and 77, the spring 145 urging the cam follower 77 absorbs a vibration and an impact due to a dispersion in the size of the cylindrical cam 78 and due to the transfer of the cam followers 76 and 77. During 0° to 180° in the timing chart of FIG. 14, the feed table 6 continues staying. During 180° to 360° in the timing chart of FIG. 14, the cam 88 rotates 180° to rotate the lever 83 counterclockwise in FIG. 5 against the force of the tension spring 85 by means of the oscillating lever 87 and the vertical reciprocating lever 84. The oscillating lever 83 moves the shutter driving bar 80 rightward in FIG. 5 to rotate the shutter driving lever 128 counterclockwise in FIG. 5. The shutter driving lever 128 moves the shutter 126 rightward in FIG. 9 and therefore the suppressing tab 129 within the slit 116 rightward in FIG. 9. Thus, the shutter 126 opens the space above the part 4 positioned at the position of the dispensation T as shown in FIG. 10.

As indicated by the first oblique line of the timing chart of the part pickup of FIG. 14, the cam (not shown) moves the vertical reciprocating rod 70 and the vertical reciprocating bar 71 downwards along the guide 72 to downwards move the block 73. The cam follower 77 and the roller mount 75 are moved downwards. The shafts 74 are moved downwards through the indexing turntable 12 to downwards move the parts mounting head 14. When the parts sucking and mounting head 14 has reached the lower limit of its movement, the suckers 13 suck the part 4.

On the other hand, the cam moves the vertical reciprocating rod 70 upwards to move the suckers retaining the part 4 to the position shown in FIG. 4, as indicated by the second oblique line of the timing chart of the part pickup of FIG. 14. During the vertical reciprocation of the parts sucking and mounting head 14, the spring 145 continues pushing the cam follower 77 on the underside of the block 73.

When the suckers 13 have almost completed returning to the elevated position, the shutter driving bar 80 starts returning to the position shown in FIG. 6 and the tension spring 130 then rotates the shutter driving lever 128 counterclockwise as shown in FIG. 6. Thereby, the shutter 126 is returned to the position shown in FIG. 6 to shut the space above the position of the dispensation T. Thus, the parts feeder completes the operation from 180° to 360° indicated in FIG. 14.

The parts feeder repeats the operation from 0° as shown in FIG. 14. From 0° to 180° in the timing chart of FIG. 14, the indexing turntable 12 intermittently advances the next parts sucking and mounting head 14 to the suction station. Since the kind of the parts feed unit 7 out of which the set of the suckers 13 sucks the next part 4 is not changed, the motor 8 does not move to continue positioning the parts feed unit 7 at the same position. From 0° to 180° in the timing chart of FIG. 14, the parts feeder dispenses the carrying tape 90 out of the parts feed unit as described above.

When the tape driving lever 32 has been fully rotated clockwise in FIG. 1, the solenoid (not shown) is de-energized to allow the L-shaped restraining lever (not shown) to engage the bolt on the rear end of the tape driving lever 32 to restrain the counterclockwise movement of the tape driving lever 32 in FIG. 3. On the other hand, the solenoid (not shown) is energized to counterclockwise move the L-shaped restraining lever (not shown) to allow the tape driving lever 34 to counterclockwise move.

Figure 16:
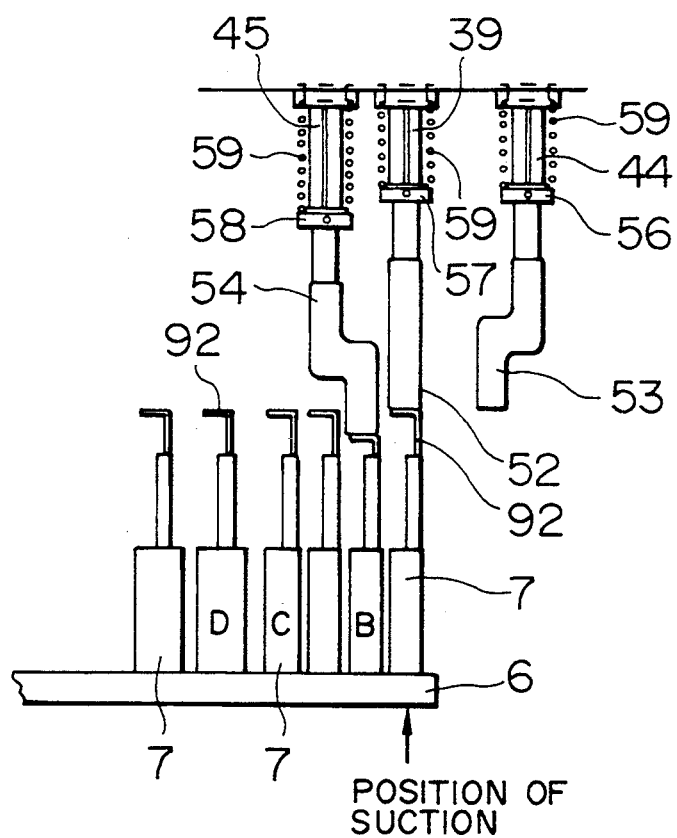
FIG. 16 is a front elevation of the tape driving tips, showing a tape dispensation out of a parts feed unit at a first position from the position of suction.

During the duration of 180° to 360° in the timing chart of FIG. 14, the shutter 126 and the parts sucking and mounting head 14 operate as described above. The cam (not shown) rotates the tape driving lever 34 counterclockwise in FIG. 3 to move the vertical reciprocating shaft 35 and the vertical reciprocating bar 41 downwards along the linear guide 40. The compression spring 59 drives the spline shaft 45 and the tape driving tip 54 downwards to depress the engaging portion 96 of the oscillating lever 92 as shown in FIG. 16. The parts feed unit 7 at the position of B dispenses the tapes 90 and 91. Then, the tape driving tip 54 moves upward.

During a next duration of 0° to 180° in the timing chart of FIG. 14, the feed table 6 is moved while the shutters 126 of all of the parts feed units 7 arranged on the feed table 6 are in the shutting position so that the parts feed unit 7 which has been positioned at the position of B is moved to under the tape driving tip 52. The motor 62 concurrently drives the ball bearing screw shaft 64 and the nut 65 to move the moving body 50 along the linear guide 66. The moving body 50 moves the roller 47 rightward along the tab 43 to move the spline shaft 45 and the tape driving tip 54 rightward to the position shown in FIG. 3.

Figure 17:
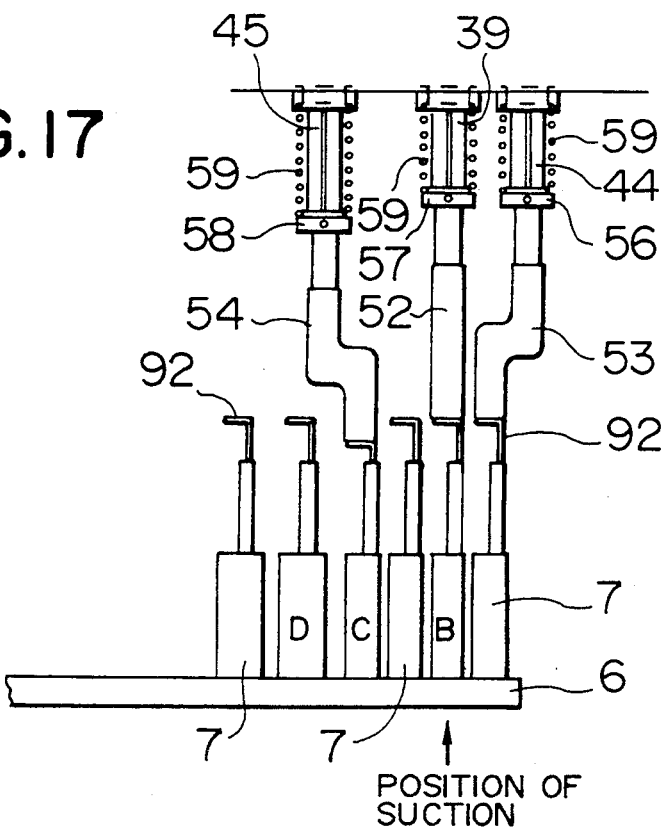
FIG. 17 is a front elevation of the tape driving tips, showing a tape dispensation out of a parts feed unit at a third position from the position of suction.
Figure 18:
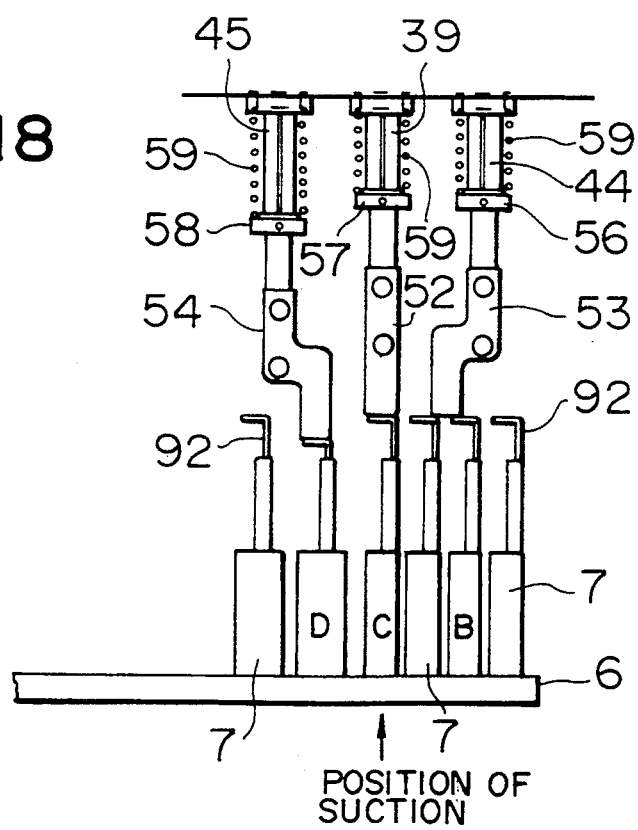
FIG. 18 is a front elevation of the tape driving tips, showing a tape dispensation out of a parts feed unit at a fourth position from the position of suction.

During a subsequent duration of 180° to 360° in the timing chart of FIG. 14, the shutter 126 of the parts feed unit 7 at the position of B opens and shuts to allow the parts sucking and mounting head 14 to pick up the part 4 out of this parts feed unit 7. Concurrently, the cam mounted on the cam shaft 21 and engaging the tape driving lever 34 rotates the tape driving lever 34 counterclockwise in FIG. 3 to move the tape driving tip 54 downwards as indicated by the timing chart of the tape feed A of FIG. 14 to dispense the tapes 90 and 91 out of the parts feed unit 7 at the position of C as shown in FIG. 17.

During a next duration of 0° to 180° in the timing chart of FIG. 14, the motor 18 moves the feed table 6 so that the tape driving tip 52 is moved to the position of C. Since the parts feed unit 7 out of which the parts sucking and mounting head 14 next picks up a part 4 has a large width of D, the motor 62 moves the moving body 50 a distance of ½ of A rightward in FIG. 3 to position the tape driving tip 54 so that the tape driving tip 54 can engage the engaging portion 96 of the oscillating lever 92 of the parts feed unit 7 at the position of D.

During a subsequent duration of 180° to 360° in the timing chart of FIG. 14, the shutter 126 of the parts feed unit 7 at the position of D opens and shuts to allow the parts sucking and mounting head 14 to pick up the part 4 out of this parts feed unit 7. Concurrently, the tape driving tip 54 drives this parts feed unit 7 to dispense the tapes 90 and 91 in the same manner as in the case of the parts feed unit 7 at the position of C.

The feed table 6 moves the parts feed unit 7 at the position of D to under the tape driving tip 52. The parts sucking and mounting head 14 picks up the part 4 as described above. When a parts feed unit 7 to dispense a next part 4 is in the ranges of movement of the tape driving tips 53 and 54, the tape driving tips 53 and 54 cause the tapes 90 and 91 to be dispensed out of this parts feed unit 7. For example, when parts feed unit 7 at the position of C dispenses the tapes 90 and 91 subsequently after the parts feed unit 7 at the position of D dispenses the tapes 90 and 91, the solenoid 24 is energized after the restraining lever (not shown) releases the tape driving lever 34, to move the restraining lever 25 counterclockwise in FIG. 3 to disengage the restraining lever 25 from the bolt 28. The restraining lever 25 releases the tape driving lever 20. The cam 22 is rotated to move the vertical reciprocating rod 29, the vertical reciprocating bar 31, the spline shaft 44 and the tape driving tip 53 downwards. The tape driving tip 53 depresses the engaging portion 96 of the cruciform oscillating lever 92 to drive the parts feed unit 7 at the position C to dispense the tapes 90 and 91. The tape driving tip 53 also drives the take-up reel 119 to take up the cover tape 91.

The parts feeder repeats the above-described operations to pick up the parts 4 out of the parts feed units 7.

When the set of the suckers 13 sucked the part 4 and the parts sucking and mounting head 14 has then moved upwards to the position shown in FIG. 4, the indexing turntable 12 is intermittently rotated and the cam follower 76 and 77 transfer from the block 73 to the cylindrical cam 78. The parts sucking and mounting head 14 retaining the part 4 is moved to the recognition station. There, the parts recognizer 15 recognizes the parts 4 retained by the parts sucking and mounting head 14.

A next indexing rotation of the indexing turntable 12 moves the parts sucking and mounting head 14 which has been staying at the recognition station to an angle correction station at which the sucker rotating roller 16 corrects a possible angular error in the position of the part 4 in the direction of θ in response to an output of the recognizer 15.

A next indexing rotation of the indexing turntable 12 moves the parts sucking and mounting head 14 which has been staying at the angle correction station to a parts mounting station. There, the X-axial motor 2 and the Y-axial motor 3 move the XY mounting table 1 in the directions of the X-and Y-axes in response to the corrected output of the recognizer 15. The parts sucking and mounting head 14 mounts the part 4 retained by the set of the suckers 13 on the printed circuit board 5 at a predetermined place.

While the parts sucking and mounting head 14 sucks the part 4 at the suction station and then moves to the mounting station, the compression spring 145 continues pushing the cam follower 77 on the underside of the cylindrical cam 78 to absorb the vibration of and the impact on the parts sucking and mounting head 14 during the transfer of the parts sucking and mounting head 14 and thus prevent a dislocation of the part 4 from the normal position relative to and slipping from the set of the suckers 13. While the cylindrical cam 78 has an ascending and descending profile, the compression spring 145 applies a constant pressure to the cam follower 77 to uniformly absorb the vibration and the impact.

The parts feeder repeats the above-described operations sequentially picks up the parts 4 out of the parts feed units 7 and mounts the parts 4 on the printed circuit board 5.

In the present embodiment of the invention, the travel distance of the moving body 50 is the distance of A. It is not restricted to the distance of A but may be longer than the distance of A.

In the present embodiment, the moving body 50 moves the bent tape driving tips 53 and 54 together. Alternatively, separate moving bodies driven by separate drives such as ball bearing screw and nut constructions may have the bent tape driving tips 53 and 54 and move them lengthwise of the feed table 6. When the travel ranges of the tape driving tips 53 and 54 cover the positions of two parts feed units 7 on the opposite sides of the parts feed unit 7 at the position of suction, the tape driving tips 53 and 54 may concurrently cause the two parts feed units 7 to dispense the tapes 90 and 91. Alternatively, the number of tape driving tips on the opposite sides of the central tape driving tip 52 may be more than two.

Alternatively, the central tape driving tip 52 fixed lengthwise of the feed table 6 may be eliminated but only tape driving tips movable lengthwise of the feed table 6 may be provided. When a single tape driving tip can move at high speed, it may drive the parts feed unit 7 at the position of suction and parts feed units 7 at positions other than the position of suction to dispense the tapes 90 and 91.

In the present embodiment, the tape driving tips 53 and 54 are moved downward during the stay of the feed table 6 (from 180° to 360° in the timing chart of FIG. 14) to drive the parts feed units 7 to dispense the tapes 90 and 91. However, the profiles of the cams for the tape driving tips 53 and 54 may alternatively be changed or separate drives other than the cams may be provided in order to move the tape driving tips 53 and 54 in accordance with movements of corresponding parts feed units 7 dispensing the tapes 90 and 91 during the movement of the feed table 6.

In the present embodiment, either of the tape driving tips 53 and 54 is moved downwards to drive the parts feed unit 7, next to the parts feed unit 7 at the position of suction to dispense the tapes 90 and 91. However, the tape driving tips 53 and 54 may additionally concurrently parts feed units 7 at second and third positions from the position of suction to dispense the tapes 90 and 91 when the travel ranges of tape driving tips 53 and 54 cover the second and third positions of the parts feed units 7. In particular, when the parts feed unit 7 at the second position from the position of suction has been moved to the position at which the tape driving tip 53 or 54 is prohibited to drive that parts feed unit 7 to dispense the tapes 90 and 91 when the parts feed unit 7 at the first position from the position of suction was moved to the position of suction and the central tape driving tip 52 drives this parts feed unit 7 to dispense the tapes 90 and 91, the tape driving tips 53 and 54 are designed to concurrently drive the two parts feed units 7 at the first end second positions from the position of suction.

In the present embodiment, the tape driving ends 52, 53 and 54 rotate the oscillating levers 92 to drive the parts feed units 7 to dispense the tapes 90 and 91. However, even if the parts feeder comprises a mechanism in which a bar is pulled to drive the parts feed unit 7 to dispense the tapes 90 and 91 or a mechanism in which a bar is pushed or pulled under the parts feed unit 7 in the direction of the feed of the tapes or other directions to drive the parts feed unit 7 to dispense the tapes 90 and 91, the parts feeder alternatively can only comprise substantially the same drive lever driving the bars as the oscillating lever 92 in the present embodiment.

What is claimed is:

1. A parts feeder, comprising:

a feed table having an upper surface;

means for moving said feed table horizontally;

a plurality of parts feed units arranged on the upper surface of said feed table, each of said parts feed units including a carrying tape carrying parts arranged on one surface of the carrying tape, a cover tape attached to the one surface of the carrying tape and covering the parts, means for peeling the cover tape from the carrying tape, means for dispensing the carrying tape to a position of a dispensation of the parts in the part feed unit while the peeling means peels the cover tape from the carrying tape, and a shutter shutting a space above the position of the dispensation of the parts to prevent the parts from escaping from the position of the dispensation of the parts;

a sucker means for sucking the parts at a position of a suction of the parts via the respective position of the dispensation of the parts in a parts feed unit positioned at the position of the suction of the parts by said feed table;

each of the said parts feed units including a tape feed drive driving the tape dispensing means and shutter drive separate from the tape feed drive, the shutter drive driving the shutter;

tape feed drive means, provided outside the parts feed units, for driving the tape feed drive of the parts feed unit positioned at a position other than the position of the suction of the parts such that the parts feed unit at the position other than the position of the suction of the parts feeds a part before that parts feed unit moves to the position of the suction of the parts; and shutter drive means, positioned outside the parts feed units, for driving the shutter drive of the parts feed unit which has been positioned at the position of the suction of the parts by said feed table, to cause the shutter to open said space, said shutter drive means outside the parts feed units causing the shutter to shut said space after the sucker has sucked the part out of the parts feed unit at the position of the suction of the parts.

2. The parts feeder according to claim 1, wherein said tape feed drive means includes at least one vertically reciprocated tape driving tip which is reciprocated via a rotating cam, said at least one tape driving tip being engagable with an oscillating lever of the feed drive of a respective one of said parts feed units.

3. The parts feeder according to claim 2, wherein said tape feed drive means includes a plurality of said vertically reciprocated tape driving tips, and including a means for horizontally moving at least one of said plurality of tape driving tips so as to position said at least one tape driving tips over at least one of said parts feeding units located on at least one side of the respective parts feed unit located at the position of the suction of the parts.

4. The parts feeder according to claim 1, wherein said shutter drive means includes a shutter driving bar which is reciprocated via a rotating cam, said shutter driving bar being engagable with a shutter operating lever of the shutter drive of a respective one of said parts feed units.

* * * * *